(12) United States Patent
Kushta et al.

(10) Patent No.: US 8,035,992 B2
(45) Date of Patent: Oct. 11, 2011

(54) VERTICAL TRANSITIONS, PRINTED CIRCUIT BOARDS THEREWITH AND SEMICONDUCTOR PACKAGES WITH THE PRINTED CIRCUIT BOARDS AND SEMICONDUCTOR CHIP

(75) Inventors: Taras Kushta, Tokyo (JP); Kaoru Narita, Tokyo (JP)

(73) Assignee: NEC Corporation, Tokyo (JP)

( * ) Notice: Subject to any disclaimer, the term of this patent is extended or adjusted under 35 U.S.C. 154(b) by 760 days.

(21) Appl. No.: 12/089,483

(22) PCT Filed: Oct. 10, 2006

(86) PCT No.: PCT/JP2006/320219
§ 371 (c)(1),
(2), (4) Date: Apr. 7, 2008

(87) PCT Pub. No.: WO2007/046271
PCT Pub. Date: Apr. 26, 2007

(65) Prior Publication Data
US 2009/0133913 A1    May 28, 2009

(30) Foreign Application Priority Data
Oct. 18, 2005    (JP) .................................. 2005-302977

(51) Int. Cl.
*H05K 9/00* (2006.01)
(52) U.S. Cl. ........ 361/818; 174/262; 361/780; 361/799; 361/800; 361/816
(58) Field of Classification Search .......... 174/260–266, 174/255, 32; 361/728, 748, 780, 783, 792–795, 361/799, 800, 816, 818, 679.01, 760, 796; 333/228, 226, 33, 32, 246, 238, 260, 204
See application file for complete search history.

(56) References Cited

U.S. PATENT DOCUMENTS

| | | | | |
|---|---|---|---|---|
| 5,331,514 | A * | 7/1994 | Kuroda ........................ | 361/760 |
| 6,075,700 | A * | 6/2000 | Houghton et al. ............ | 361/704 |
| 6,125,042 | A * | 9/2000 | Verdi et al. .................... | 361/760 |
| 6,670,559 | B2 | 12/2003 | Centola et al. | |
| 6,747,216 | B2 | 6/2004 | Brist et al. | |
| 7,420,126 | B2 * | 9/2008 | Shibata et al. ................ | 174/255 |
| 7,579,553 | B2 * | 8/2009 | Moriizumi .................... | 174/260 |
| 2002/0179332 | A1 * | 12/2002 | Uematsu et al. .............. | 174/262 |
| 2003/0091730 | A1 | 5/2003 | Jessep et al. | |
| 2004/0069529 | A1 * | 4/2004 | Oggioni et al. ............... | 174/262 |
| 2005/0029013 | A1 * | 2/2005 | Lee ............................... | 174/262 |
| 2005/0098348 | A1 * | 5/2005 | Okumichi et al. ............ | 174/262 |

FOREIGN PATENT DOCUMENTS

JP    06085099 A    3/1994
(Continued)

*Primary Examiner* — Hoa C Nguyen
(74) *Attorney, Agent, or Firm* — Sughrue Mion, PLLC

(57) ABSTRACT

Provided are vertical transitions which have the high electrical performance and the high shielding properties in the wide frequency band in a multilayer PCB, printed circuit boards with the vertical transitions and semiconductor packages with the printed circuit boards and semiconductor chips. In vertical transitions for a multilayer PCB, a wave guiding channel is a conductor which includes at least more than one of signal vias 201, an assembly of ground vias 202 surrounding the signal via, ground plates from conductor layers of the PCB connected to the ground vias, closed ground striplines 205 connecting the ground vias and power supply layer.

27 Claims, 20 Drawing Sheets

FOREIGN PATENT DOCUMENTS

| | | |
|---|---|---|
| JP | 10041630 A | 2/1998 |
| JP | 11054869 A | 2/1999 |
| JP | 2000183582 A | 6/2000 |
| JP | 2000216510 A | 8/2000 |
| JP | 2000236045 A | 8/2000 |
| JP | 2001135899 A | 5/2001 |
| JP | 2001144511 A | 5/2001 |
| JP | 2002009193 A | 1/2002 |
| JP | 2003100941 A | 4/2003 |
| JP | 2004120659 A | 4/2004 |

* cited by examiner

US 8,035,992 B2

VERTICAL TRANSITIONS, PRINTED CIRCUIT BOARDS THEREWITH AND SEMICONDUCTOR PACKAGES WITH THE PRINTED CIRCUIT BOARDS AND SEMICONDUCTOR CHIP

TECHNICAL FIELD

The present invention relates to multilayer printed circuit board technology, and more particularly, relates to vertical transitions connecting circuits disposed at different planar conductor layers of a multilayer printed circuit board (hereinafter referred to a multilayer PCB), printed circuit boards with the vertical transitions and semiconductor packages with the printed circuit boards and semiconductor chips.

BACKGROUND ART

A multilayer PCB usually comprises a number of planar conductor layers used for signal, ground and power supplies where the conductor layers are isolated by a material. Planar interconnect circuits embedded in the PCB can be developed on the base of transmission lines such as microstrip lines, strip lines, coplanar lines, and slot lines which have typically low leakage losses and well-defined characteristic impedance. These properties of planar transmission lines give a possibility to develop high-performance and matched interconnections based on PCB technologies. Vertical transitions in the PCB which serve to connect planar interconnected circuits disposed at the different conductor layers are usually based on various types of via structures such as through hole vias, blind vias, counter-bored, and buried vias (see Patent Document No. 1). These transitions have usually poor-defined wave guiding properties that leads to problems in controlling characteristic impedance and high leakage, especially, at higher frequencies.

As a solution to improve guiding and shielding properties of vertical transitions in multilayer PCBs at higher frequencies, ground vias surrounding a signal via can be used. Such ground vias are usually connected to ground planes of the multilayer PCB. As a rule, a multilayer PCB includes power supply planar conductor layers. To provide passages of ground vias through power supply layers the clearance hole isolating each ground via and the power supply plane is usually used around each ground via (see Patent Document Nos. 2-8).

Referring to the drawings, a signal via 101 in a 12-conductor-layer PCB, which serves only as an example of multilayer PCB design, is shown in FIGS. 1A and 1B. FIG. 1B shows a cross-sectional view of a vertical transition (in a direction of a dotted line 1B in FIG. 1A), the arrangement of conductor layers of the PCB separated by an isolating material is as follows: Ground planes are 2nd, 4th, 6th, 7th, 9th, and 11th layers; Power supply plane is 5th layer; Signal planes are 1st, 3rd, 8th, 10th, and 12th layers. The signal via is separated from conductor planes of the PCB by a clearance hole 103.

FIG. 1A shows a top view of a power supply layer which is 5th layer of a vertical transition.

At higher frequencies the single signal via 101 through clearance hole 103 has high leakage loss which degrades the electrical performance of this vertical interconnection. To decrease leakage loss ground via fence (a group of ground vias) 1021 which comprises a plurality of ground vias (see FIG. 3) surrounding the signal via 101 can be used. In this case ground vias 102 passing through the ground planes are electrically connected to these planes. At the power supply layer (5th layer in considered example) to prevent electrical contact between ground vias 102 and power supply layer 109 the clearance hole 104 can be formed around each ground via 102.

It is well-known that in a multilayer PCB parallel-plate modes can excite between conductor planes including space between power supply and ground layers. Conducting planes (power supply plane (power supply layer) 109 and ground plane (ground plate) 108 in present example shown in FIG. 2) of a multilayer PCB or a package can form a parallel-plate waveguide in which guided modes (waves) can exist. The fundamental mode of the parallel-plate waveguide is a Transverse Electromagnetic Mode or TEM mode which can propagate at all frequencies. The electric field of the TEM mode is normal to the planes (in the x direction) so that the associated magnetic field is parallel to the planes (in the y direction). The parallel-plate modes (PPMs) can resonate with via structures and also with edges of the PCB 110 (or package). Due to such resonances the electrical performance of a signal via can make worse considerably. The application of ground via fence 1021 around the signal via as shown in FIG. 3 and using the clearance hole around each ground via are ways to prevent the signal via from the parallel-plate mode resonance effect.

Patent Document No. 1: Specification of U.S. Pat. No. 6,670,559
Patent Document No. 2: Specification of U.S. Pat. No. 6,747,216
Patent Document No. 3: Specification of US Patent Application Publication No. 2003/0091730
Patent Document No. 4 Japanese Patent Application Publication No. 2000-183582
Patent Document No. 5 Japanese Patent Application Publication No. 2001-135899
Patent Document No. 6 Japanese Patent Application Publication No. 2003-100941
Patent Document No. 7 Japanese Patent Application Publication No. 10-041630
Patent Document No. 8 Japanese Patent Application Publication No. 11-054869

DISCLOSURE OF THE INVENTION

Problem to be Solved by the Invention

However, it is found that only using the clearance hole around ground vias does not satisfy shielding properties by a ground via fence. For example, when a clearance hole is provided around ground vias in a power supply layer, only using the clearance hole around each ground via does not improve the properties. As the result, these clearance holes degrade the electrical performance by noises.

Accordingly, a first exemplary object of the invention is to provide vertical transitions which have the high electrical performance and the high shielding properties in the wide frequency band in a multilayer PCB, printed circuit boards with the vertical transitions and semiconductor packages with the printed circuit boards and semiconductor chips.

Means for Solving Problem

The concrete constitution of a vertical transition for a multilayer PCB according to an exemplary object of the invention is as follows:

A vertical transition which comprises at least more than one of signal vias and a plurality of ground vias around the signal vias comprising:
a plurality of conductor layers; and
a plurality of isolating layers between the conductor layers, wherein: at least one conductor layer is formed in an outer circumference of the vertical transition at a fixed distance from the vertical transition.

This constitution can reduce the influence by resonances of parallel plate modes etc. with signal propagating in the vertical transition and can improve highly the electrical performance and the shielding properties in the wide frequency band of the vertical transition.

In addition, at least one conductor layer which is formed in an outer circumference of the vertical transition at a fixed distance from the vertical transition may be a power supply layer.

The above constitution in the power supply layer can reduce the influence by resonances of parallel plate modes etc. with signal propagating in the vertical transition and can improve highly the electrical performance and the shielding properties in the wide frequency band of the vertical transition.

In addition, at least one conductor layer which is formed in an outer circumference of the vertical transition at a fixed distance from the vertical transition may be a ground layer.

The above constitution in the ground layer can reduce the influence by resonances of parallel plate modes etc. with signal propagating in the vertical transition and can improve highly the electrical performance and the shielding properties in the wide frequency band of the vertical transition.

In addition, at least one conductor layer which is formed in an outer circumference of the vertical transition at a fixed distance from the vertical transition may be a signal layer.

The above constitution in the signal layer can reduce the influence by resonances of parallel plate modes etc. with signal propagating in the vertical transition and can improve highly the electrical performance and the shielding properties in the wide frequency band of the vertical transition.

In addition, at least two conductor layers which are formed in an outer circumference of the vertical transition at a fixed distance from the vertical transition may be a power supply layer and a ground layer.

The above constitution in the power supply layer and the ground layer can reduce the influence by resonances of parallel plate modes etc. with signal propagating in the vertical transition and can improve highly the electrical performance and the shielding properties in the wide frequency band of the vertical transition.

In addition, at least two conductor layers which are formed in an outer circumference of the vertical transition at a fixed distance from the vertical transition may be a power supply layer and a signal layer.

The above constitution in the power supply layer and the signal layer can reduce the influence by resonances of parallel plate modes etc. with signal propagating in the vertical transition and can improve highly the electrical performance and the shielding properties in the wide frequency band of the vertical transition.

In addition, at least two conductor layers which are formed in an outer circumference of the vertical transition at a fixed distance from the vertical transition may be a ground layer and a signal layer.

The above constitution in the ground layer and the signal layer can reduce the influence by resonances of parallel plate modes etc. with signal propagating in the vertical transition and can improve highly the electrical performance and the shielding properties in the wide frequency band of the vertical transition.

In addition, at least three conductor layers which are formed in an outer circumference of the vertical transition at a fixed distance from the vertical transition may be a power supply layer, a ground layer and a signal layer.

The above constitution in the power supply layer, the ground layer and the signal layer can reduce the influence by resonances of parallel plate modes etc. with signal propagating in the vertical transition and can improve highly the electrical performance and the shielding properties in the wide frequency band of the vertical transition.

In addition, the vertical transition may comprise a closed ground stripline connecting the plurality of ground vias at a power supply layer or a ground layer or a signal layer.

It is particularly important to use the above closed ground stripline at a power supply layer or a ground layer or a signal layer. Therefore, this can reduce the influence by resonances of parallel plate modes etc. with signal propagating in the vertical transition and can improve the metallization of the vertical transition.

In addition, the vertical transition further may comprise a clearance hole separating the signal via from the plurality of ground vias, wherein:

the clearance may be filled by an isolating material with constitutive parameters (relative permittivity and permeability) which are different from constitutive parameters of a PCB isolating material.

Since characteristic impedance can be controlled by selecting the material of the clearance hole suitably, the dimension of the vertical transition can be compressed by using the above different material for the clearance hole.

The concrete constitution of a printed circuit board according to an exemplary object of the invention is as follows:

A printed circuit board including a vertical transition which comprises at least more than one of signal vias and a plurality of ground vias around the signal vias comprising:

a plurality of conductor layers; and a plurality of isolating layers between the conductor layers, wherein: at least one conductor layer is formed in an outer circumference of the vertical transition at a fixed distance from the vertical transition.

This constitution can reduce the influence by resonances of parallel plate modes etc. with signal propagating in the vertical transition and can improve highly the electrical performance and the shielding properties in the wide frequency band of the vertical transition.

In addition, at least one conductor layer which is formed in an outer circumference of the vertical transition at a fixed distance from the vertical transition may be a power supply layer.

The above constitution in the power supply layer can reduce the influence by resonances of parallel plate modes etc. with signal propagating in the vertical transition and can improve highly the electrical performance and the shielding properties in the wide frequency band of the vertical transition.

In addition, at least one conductor layer which is formed in an outer circumference of the vertical transition at a fixed distance from the vertical transition may be a ground layer.

The above constitution in the ground layer can reduce the influence by resonances of parallel plate modes etc. with signal propagating in the vertical transition and can improve highly the electrical performance and the shielding properties in the wide frequency band of the vertical transition.

In addition, at least one conductor layer which is formed in an outer circumference of the vertical transition at a fixed distance from the vertical transition may be a signal layer.

The above constitution in the signal layer can reduce the influence by resonances of parallel plate modes etc. with signal propagating in the vertical transition and can improve highly the electrical performance and the shielding properties in the wide frequency band of the vertical transition.

In addition, at least two conductor layers which are formed in an outer circumference of the vertical transition at a fixed distance from the vertical transition may be a power supply layer and a ground layer.

The above constitution in the power supply layer and the ground layer can reduce the influence by resonances of parallel plate modes etc. with signal propagating in the vertical transition and can improve highly the electrical performance and the shielding properties in the wide frequency band of the vertical transition.

In addition, at least two conductor layers which are formed in an outer circumference of the vertical transition at a fixed distance from the vertical transition may be a power supply layer and a signal layer.

The above constitution in the power supply layer and the signal layer can reduce the influence by resonances of parallel plate modes etc. with signal propagating in the vertical transition and can improve highly the electrical performance and the shielding properties in the wide frequency band of the vertical transition.

In addition, at least two conductor layers which are formed in an outer circumference of the vertical transition at a fixed distance from the vertical transition may be a ground layer and a signal layer.

The above constitution in the ground layer and the signal layer can reduce the influence by resonances of parallel plate modes etc. with signal propagating in the vertical transition and can improve highly the electrical performance and the shielding properties in the wide frequency band of the vertical transition.

In addition, at least three conductor layers which are formed in an outer circumference of the vertical transition at a fixed distance from the vertical transition may be a power supply layer, a ground layer and a signal layer.

The above constitution in the power supply layer, the ground layer and the signal layer can reduce the influence by resonances of parallel plate modes etc. with signal propagating in the vertical transition and can improve highly the electrical performance and the shielding properties in the wide frequency band of the vertical transition.

In addition, the vertical transition may comprise a closed ground stripline connecting the plurality of ground vias at a power supply layer or a ground layer or a signal layer.

It is particularly important to use the above closed ground stripline at a power supply layer or a ground layer or a signal layer. Therefore, this can reduce the influence by resonances of parallel plate modes etc. with signal propagating in the vertical transition and can improve the metallization of the vertical transition.

In addition, the vertical transition further may comprise a clearance hole separating the signal via from the plurality of ground vias, wherein:

the clearance may be filled by an isolating material with constitutive parameters (relative permittivity and permeability) which are different from constitutive parameters of a PCB isolating material.

Since characteristic impedance can be controlled by selecting the material of the clearance hole suitably, the dimension of the vertical transition can be compressed by using the above different material for the clearance hole.

The concrete constitution of a semiconductor package according to an exemplary object of the invention is as follows:

A semiconductor package comprising:
a printed circuit board; and
a semiconductor device, wherein:
the printed circuit board including a vertical transition which comprises at least more than one of signal vias and a plurality of ground vias around the signal vias comprising:
a plurality of conductor layers; and
a plurality of isolating layers between said conductor layers, wherein:
at least one conductor layer is formed in an outer circumference of the vertical transition at a fixed distance from the vertical transition, and wherein: the semiconductor device connecting a signal terminal to the signal via of the printed circuit board and connecting a ground terminal to the ground vias of the printed circuit board.

This constitution can reduce the influence by resonances of parallel plate modes etc. with signal propagating in the vertical transition and can improve highly the electrical performance and the shielding properties in the wide frequency band of the vertical transition.

In addition, at least one conductor layer which is formed in an outer circumference of the vertical transition at a fixed distance from the vertical transition may be a power supply layer.

The above constitution in the power supply layer can reduce the influence by resonances of parallel plate modes etc. with signal propagating in the vertical transition and can improve highly the electrical performance and the shielding properties in the wide frequency band of the vertical transition.

In addition, at least one conductor layer which is formed in an outer circumference of the vertical transition at a fixed distance from the vertical transition may be a ground layer.

The above constitution in the ground layer can reduce the influence by resonances of parallel plate modes etc. with signal propagating in the vertical transition and can improve highly the electrical performance and the shielding properties in the wide frequency band of the vertical transition.

In addition, at least one conductor layer which is formed in an outer circumference of the vertical transition at a fixed distance from the vertical transition may be a signal layer.

The above constitution in the signal layer can reduce the influence by resonances of parallel plate modes etc. with signal propagating in the vertical transition and can improve highly the electrical performance and the shielding properties in the wide frequency band of the vertical transition.

In addition, at least two conductor layers which are formed in an outer circumference of the vertical transition at a fixed distance from the vertical transition may be a power supply layer and a ground layer.

The above constitution in the power supply layer and the ground layer can reduce the influence by resonances of parallel plate modes etc. with signal propagating in the vertical transition and can improve highly the electrical performance and the shielding properties in the wide frequency band of the vertical transition.

In addition, at least two conductor layers which are formed in an outer circumference of the vertical transition at a fixed distance from the vertical transition may be a power supply layer and a signal layer.

The above constitution in the power supply layer and the signal layer can reduce the influence by resonances of parallel plate modes etc. with signal propagating in the vertical transition and can improve highly the electrical performance and the shielding properties in the wide frequency band of the vertical transition.

In addition, at least two conductor layers which are formed in an outer circumference of the vertical transition at a fixed distance from the vertical transition may be a ground layer and a signal layer.

The above constitution in the ground layer and the signal layer can reduce the influence by resonances of parallel plate modes etc. with signal propagating in the vertical transition and can improve highly the electrical performance and the shielding properties in the wide frequency band of the vertical transition.

In addition, at least three conductor layers which are formed in an outer circumference of the vertical transition at a fixed distance from the vertical transition may be a power supply layer, a ground layer and a signal layer.

The above constitution in the power supply layer, the ground layer and the signal layer can reduce the influence by resonances of parallel plate modes etc. with signal propagating in the vertical transition and can improve highly the electrical performance and the shielding properties in the wide frequency band of the vertical transition.

In addition, the vertical transition may comprise a closed ground stripline connecting the plurality of ground vias at a power supply layer or a ground layer or a signal layer.

It is particularly important to use the above closed ground stripline at a power supply layer or a ground layer or a signal layer. Therefore, this can reduce the influence by resonances of parallel plate modes etc. with signal propagating in the vertical transition and can improve the metallization of the vertical transition.

In addition, the vertical transition further may comprise a clearance hole separating the signal via from the plurality of ground vias, wherein:

the clearance may be filled by an isolating material with constitutive parameters (relative permittivity and permeability) which are different from constitutive parameters of a PCB isolating material.

Since characteristic impedance can be controlled by selecting the material of the clearance hole suitably, the dimension of the vertical transition can be compressed by using the above different material for the clearance hole.

Effect of the Invention

An exemplary advantage according to the invention of the above constitution is capable of reducing the influence by resonances of parallel plate modes etc. with signal propagating in the vertical transition and is capable of improving highly the electrical performance and the shielding properties in the wide frequency band of the vertical transition in a multilayer PCB.

In addition, it is particularly important to use the above closed ground stripline in the above constitution at a power supply layer or a ground layer or a signal layer. Therefore, this can reduce the influence by resonances of parallel plate modes etc. with signal propagating in the vertical transition and can improve the metallization of the vertical transition.

In addition, since characteristic impedance can be controlled by selecting the material of the clearance hole suitably, the dimension of the vertical transition can be compressed by using the above different material for the clearance hole.

EXPLANATION OF NUMERALS

Figure 1A:
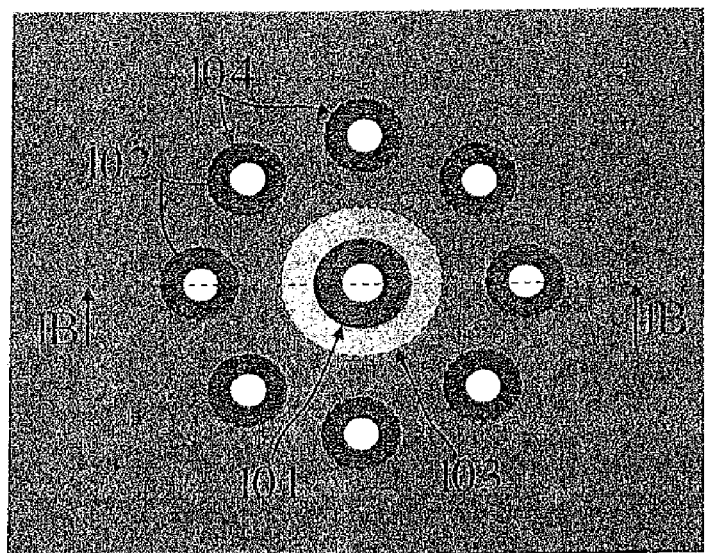
FIG. 1A shows a top view of a power supply layer which is 5th layer of a vertical transition in a related multilayer PCB.

101, 201, 301, 401, 501, 601, 701, 801, 901, 1001, 1101, 1201, 1301, 1401, 1501, 1601, 1701, 1801, 1901 signal via
102, 202, 402, 502, 602, 702, 802, 902, 1002, 1102, 1202, 1302, 1402, 1502, 1602, 1702, 1802, 1902 ground via
103, 104, 203, 403, 503, 603, 703, 803, 903, 1003, 1004, 1103, 1203, 1303, 1403, 1503, 1603, 1703, 1803, 1903 clearance hall
205, 405, 505, 605, 705, 805, 905, 1005, 1105, 1205, 1305, 1405, 1505, 1605, 1705, 1805, 1905 ground stripline
206, 406, 506, 606, 706, 806, 906, 1006, 1106, 1206, 1306, 1406, 1506, 1606, 1706, 1806, 1906 isolating slot
107, 207, 407, 507, 1007, 1207 signal layer
108, 208, 408, 508, 608, 708, 808, 908, 1008, 1108, 1208, 1308, 1408, 1608, 1708, 1808, 1908 ground plate
109, 209, 409, 509, 609, 709, 809, 909, 1009, 1109, 1209, 1309, 1409, 1609, 1709, 1809, 1909 power supply layer of PCB
110 edges of PCB
610, 710, 810, 1110, 1210, 1610 stripline
711, 811, 1611 microstrip line
1021 ground via fence
1720, 1820, 1920 chip
1720, 1820, 1920 multilayer package

BEST MODE FOR CARRYING OUT THE INVENTION

The following description of the best mode for carrying out the invention directed to several examples only of vertical transitions but it is well understood that this description should not be viewed as narrowing the claims which follows.

A First Exemplary Embodiment

Figure 4A:
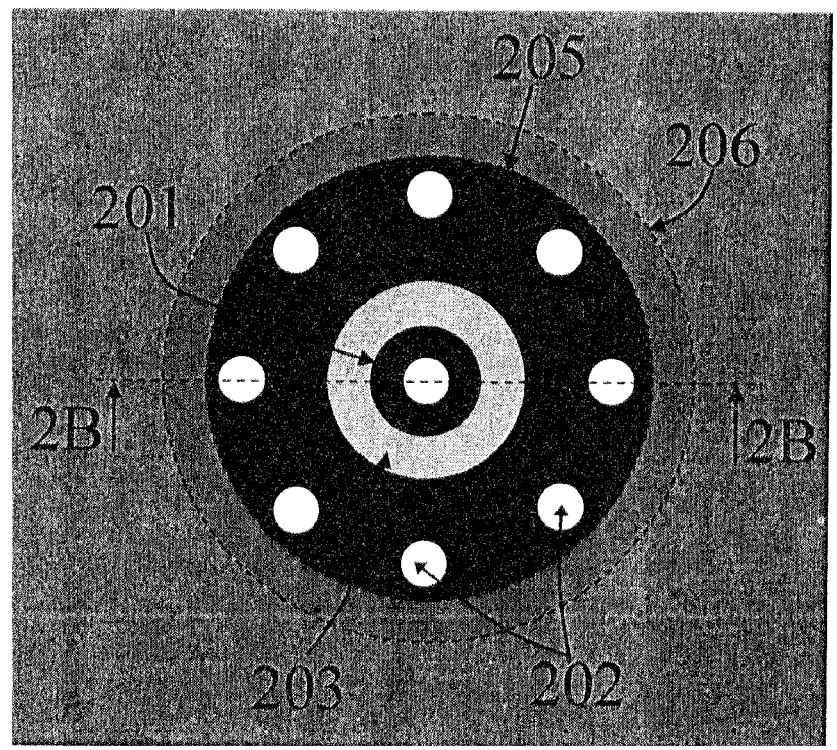
FIG. 4A shows a top view of a vertical transition in a multilayer PCB of a first exemplary embodiment.
Figure 4B:
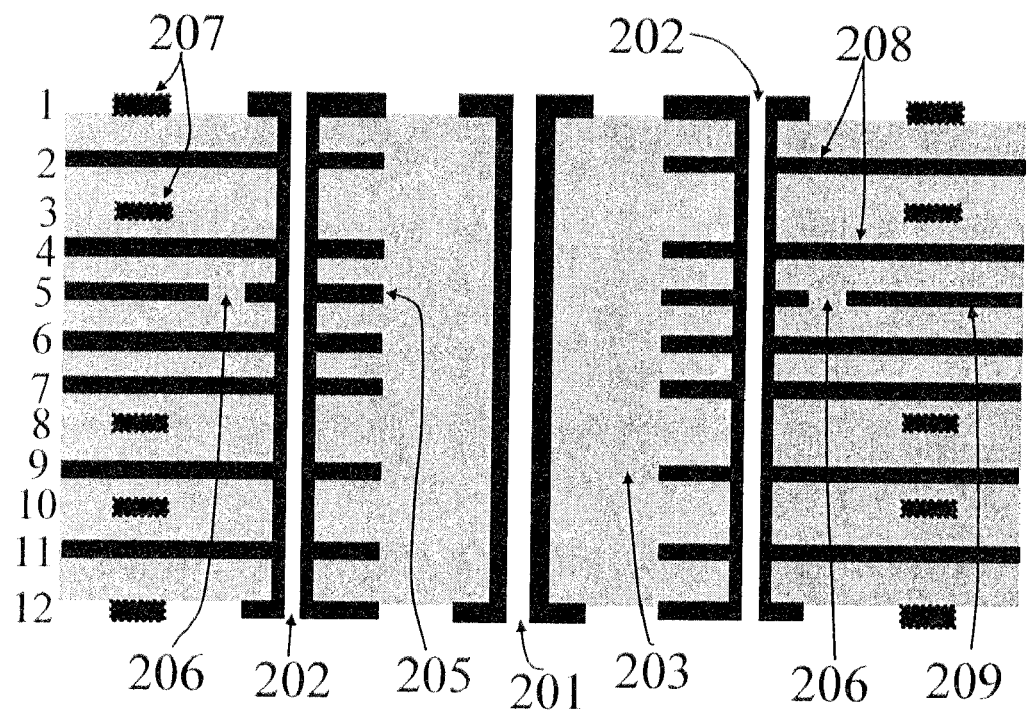
FIG. 4B shows a cross-sectional view of a vertical transition in a multilayer PCB of a first exemplary embodiment.

Referring to the drawings, FIGS. 4A and 4B show a vertical transition with a round arrangement of ground vias 202 of a first exemplary embodiment. The vertical transition is embedded in a 12-conductor-layer PCB.

FIG. 4B shows a cross-sectional view of a vertical transition (in a direction of a dotted line 2B in FIG. 4A), the arrangement of conductor layers of the PCB separated by an isolating material is as follows: Ground planes are 2nd, 4th, 6th, 7th, 9th, and 11th layers; Power supply plane is 5th layer; Signal planes are 1st, 3rd, 8th, 10th, and 12th layers. The single signal via 201 is separated electrically from conductor planes of the PCB by a clearance hole 203.

FIG. 4A shows a top view of a power supply layer which is 5th layer of a vertical transition. The number of ground vias 202 is 8. In addition, although the number of ground vias 202 is 8 here, the number can be selected as necessary.

To improve the shielding properties around the ground via fence (a group of ground vias) we propose to use an isolating slot around the ground via fence in a power supply layer as shown in FIGS. 4A and 4B. In this case a high-isolating vertical transition is formed as a specific coaxial waveguide in a multilayer PCB.

In said coaxial waveguide an inner conductive boundary is formed by a signal via 201, and an outer conductive boundary of this coaxial waveguide is formed by an assembly of ground vias 202, ground plates 208 from conductor layers connected to the ground vias 202, closed ground stripline 205 connecting the ground vias in turn, and an isolating slot 206 between said ground stripline and power supply layer 209 of the PCB. Such vertical transition has also improved metallization of the outer conductive boundary due to the use of the closed ground stripline 205 at the power supply layer. A clearance hole 203, which separates the inner and outer conductive boundaries of said coaxial waveguide, can have form and dimensions providing the minimal return losses of the vertical transition in the predetermined frequency band.

Figure 5A:
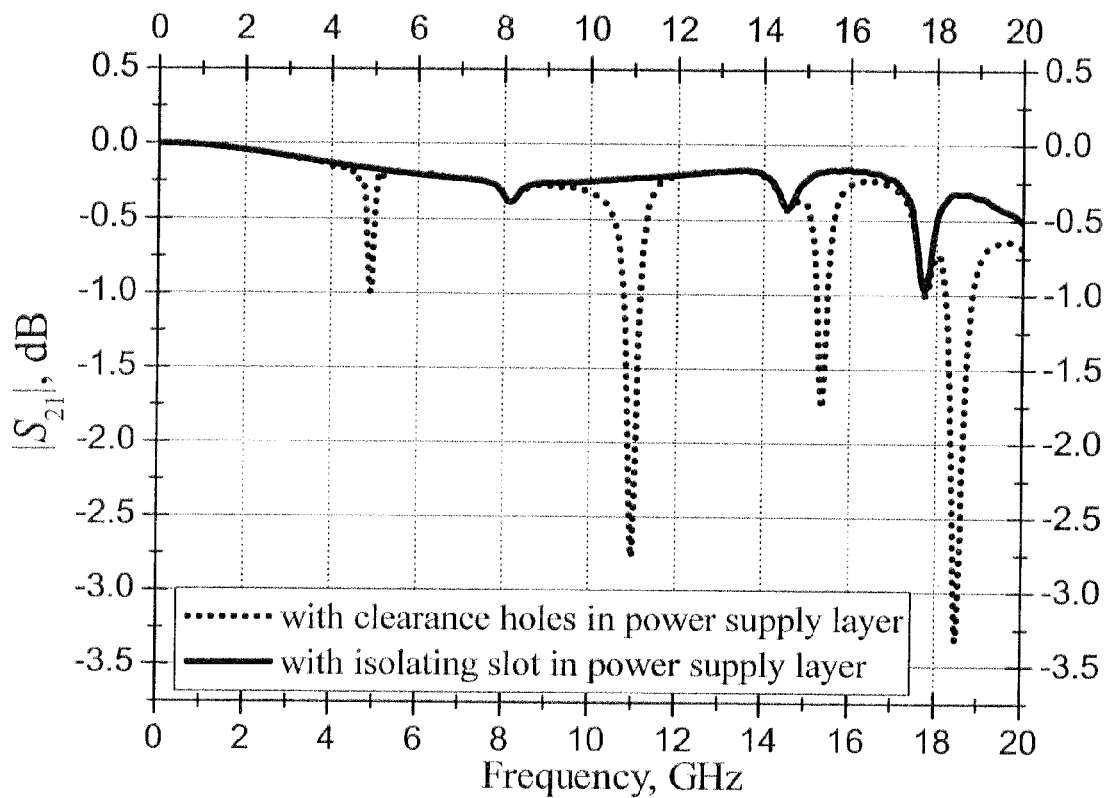
FIG. 5A shows simulated results of the electrical performance ($|S_{21}|$-parameter) of two types of vertical transitions in the multilayer PCB: In one type, the clearance hole is made around each ground via at a power supply layer; In another type, an isolating slot is made around an assembly of ground vias at the power supply layer to form a high-isolated vertical transition.

To show an advantage of invented vertical transitions in PCB applications simulated insertion loss ($|S_{21}|$-parameter) is presented in FIG. 5A. In this figure the magnitude of the S-parameter against frequency is calculated by the finite-difference time-domain (FDTD) algorithm, which is one of the most accurate numerical methods to characterize three-dimensional structures.

Figure 1B:
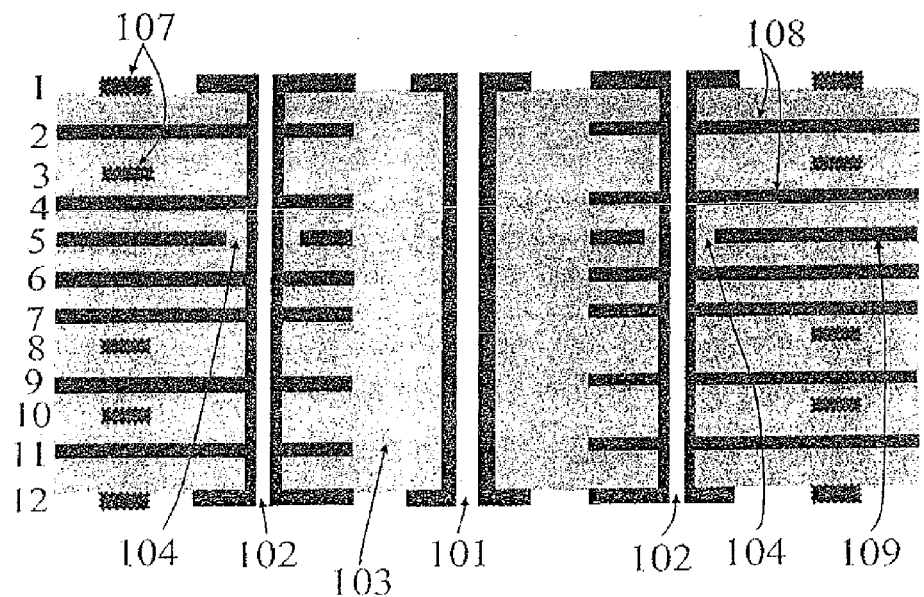
FIG. 1B shows a cross-sectional view of a vertical transition in a related multilayer PCB.
Figure 2:
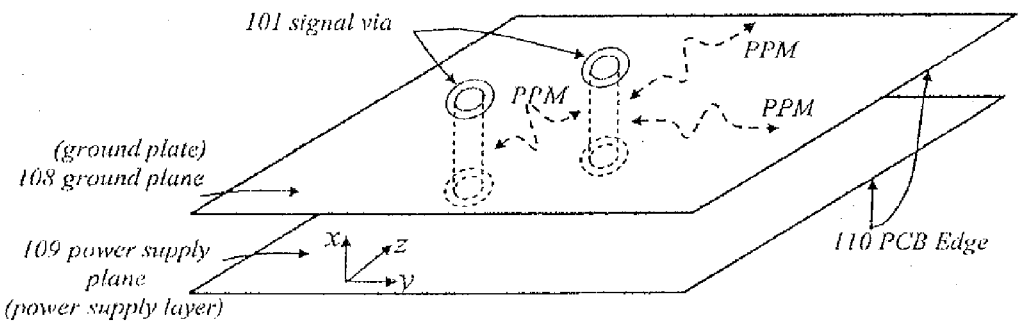
FIG. 2 shows that a parallel-plate waveguide in which guided modes (waves) can exist is formed in power supply plane (power supply layer) and ground plane (ground plate).
Figure 3:
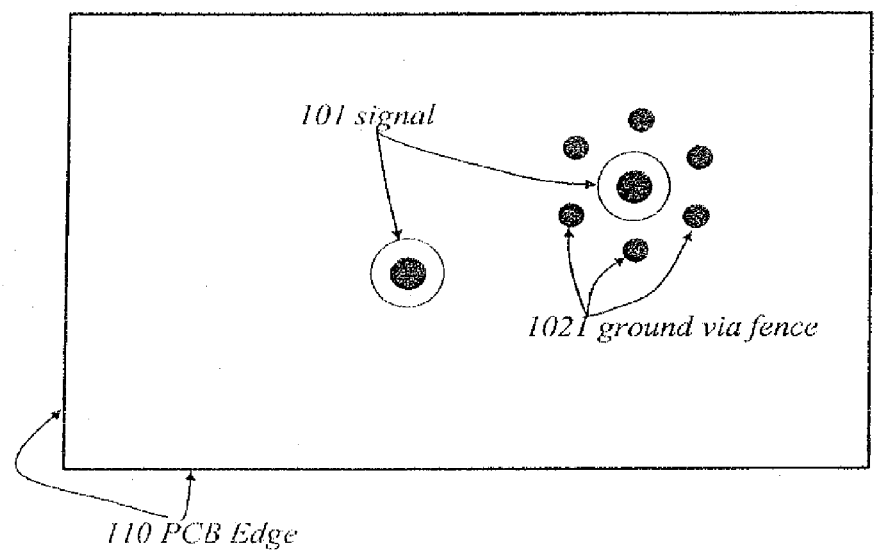
FIG. 3 shows that the ground via fence around the signal via is applied in order to prevent the signal via from the parallel-plate mode resonance effect.

Configurations of vertical transitions in the PCB, for which numerical analysis is carried out, are shown in FIGS. 1A, 1B and 4A, 4B. The dimensions of the vertical transition shown in FIGS. 1A and 1B are as follows: The outer diameter of the signal via 101 conductor in a board shown in FIG. 1A is 0.65 mm; the distance between the centers of the diametrically opposite ground vias 102 formed by a plurality of ground vias is 3.5 mm; the clearance hole 103 diameter of the signal via 101 shown in FIG. 1A is 1.65 mm; the outer diameter of the ground via 102 conductor is 0.3 mm; the clearance hole 104 diameter around the ground via 102 at the power supply layer is 0.6 mm; the thickness of the PCB including all conductor layers is 2.5 mm; the relative permittivity of material isolating the conductive layers of the PCB is 4.2. The signal via is placed between 50-Ohms coaxial cables connected to the signal via pads disposed at the top and bottom layers of the PCB. The number of ground vias 102 is 8. In addition, although the number of ground vias 102 is 8 here, the number can be selected as necessary. The eight ground vias are equally spaced around the signal via with the same distance between neighboring ground vias.

The parameters of the vertical transition shown in FIGS. 4A and 4B are the same as in FIGS. 1A and 1B. However, instead of clearance holes 104 used for ground vias 102 at the power supply layer an isolating slot 206 is applied as shown in FIGS. 4A and 4B. This slot 206 the inner side of which is placed on the distance of 2.05 mm from the center of the signal via has the width of 0.2 mm.

Considered two types of vertical transitions are affected by the parallel plate-mode resonances due to the edge effect of the PCB. As follows from FIG. 5A the electrical performance of the vertical transition with clearance holes 104 around ground vias 102 at the power supply layer (see FIGS. 1A and 1B) degrades considerably at the resonance frequencies. However the electrical performance of the vertical transition with the isolating slot around the assembly of ground vias at the power supply layer remains high in the frequency band.

Presented numerical results show a promise of a method to form a high-isolated vertical transition in a multilayer PCB applying isolating slots at conductor layers of the PCB.

Figure 5B:
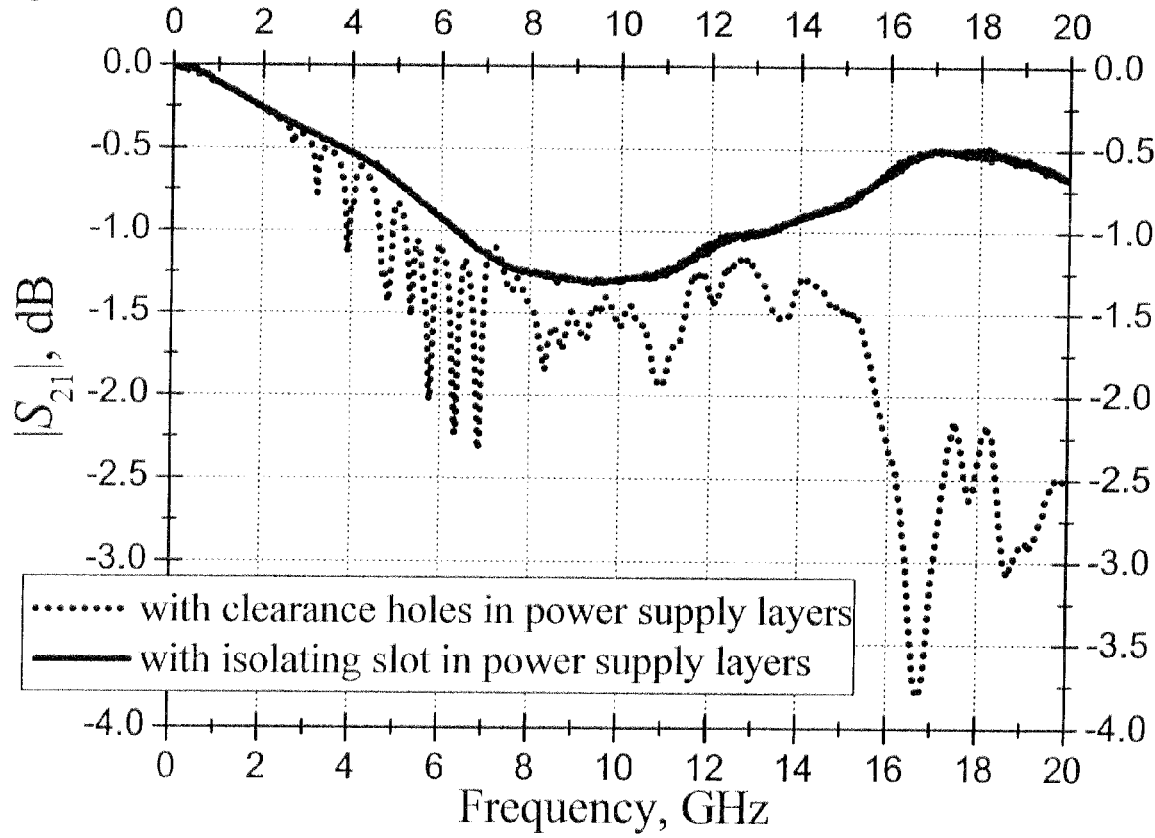
FIG. 5B shows experimental results of the electrical performance ($|S_{21}|$-parameter) of two types of vertical transitions in the multilayer PCB populated by other via structures which can excite unwanted parallel plate modes at power supply layers: In one type, the clearance hole is made around each ground via at power supply layers; In another type, isolating slots are made around an assembly of ground vias at the power supply layers to form a high-isolated vertical transition.

To verify simulated results experimentally obtained for vertical transitions in multilayer PCBs we considered the same configurations of vertical transitions embedded in the PCB as in FIGS. 1A, 1B and 4A, 4B. The dimensions of the vertical transitions and parameters of the PCB are the same as for simulations shown in FIG. 5A, but only in experimental patterns the distance between the centers of the diametrically opposite ground vias is 3.35 mm and the inner side of the isolating slot with width of 0.2 mm is placed on the distance of 2.0 mm from the center of the signal via. Also, the PCB is populated by other via structures that lead to excitation of unwanted resonant parallel plate modes. In FIG. 5B, experimental data for both types of vertical transitions with clearance holes around ground vias and with isolating slots at power supply layers of the PCB are shown. Similarly to simulated data, measurements show clearly-expressed advantage of the vertical transition with the isolating slot at power supply layers.

Thus, as follows from presented simulated and measured results, the isolating slot at the power supply layer is important element in forming a high-performance vertical transition in a multilayer PCB. Such slots separate the vertical transition (the inner and outer conductive boundary) from the power supply layers and resonances which can appear in these layers. While, in the case of the use of clearance holes around ground vias at power supply layers, these layers pass through the outer conductive boundary of the vertical transitions that lead to interaction of resonant parallel plate modes, which can be excited in power supply layers, with signal propagating in the vertical transition.

A Second Exemplary Embodiment

Figure 6A:
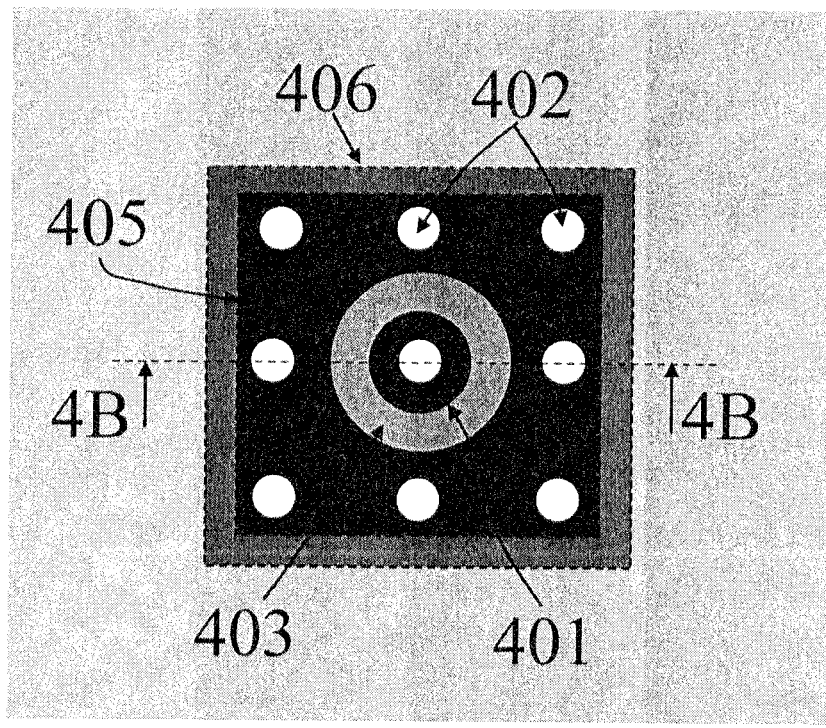
FIG. 6A shows a top view of a vertical transition in a multilayer PCB of a second exemplary embodiment.
Figure 6B:
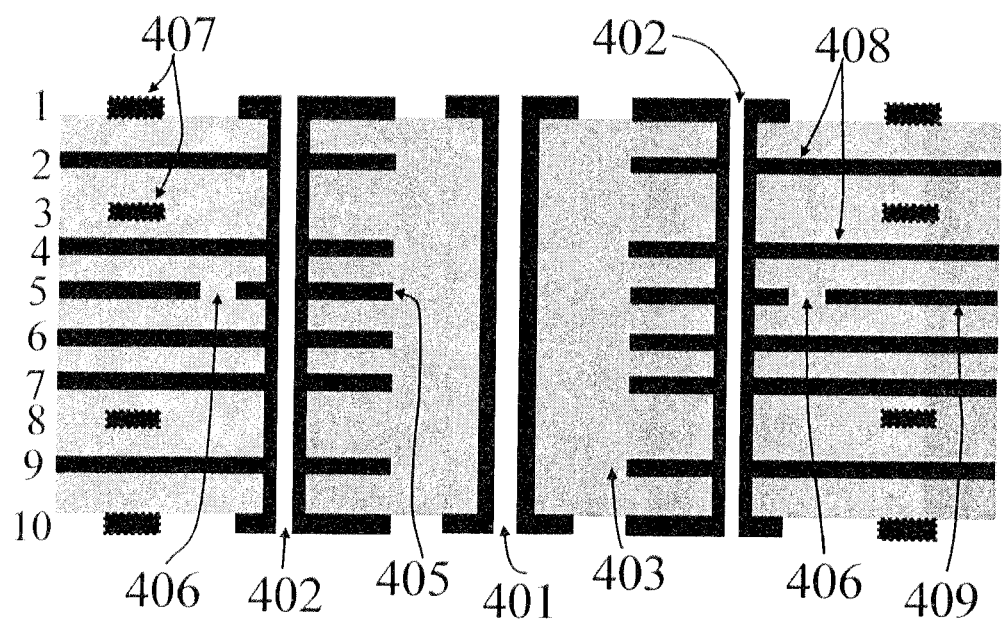
FIG. 6B shows a cross-sectional view of a vertical transition in a multilayer PCB of a second exemplary embodiment.

In FIGS. 6A and 6B a vertical transition with another arrangement of ground vias 402 such as square one is shown. This vertical transition is embedded in a 10-conductor-layer PCB which serves as an example of multilayer PCBs.

FIG. 6B shows a cross-sectional view of a vertical transition (in a direction of a dotted line 4B in FIG. 6A), the arrangement of conductor layers of the PCB separated by an isolating material is as follows: Ground planes are 2nd, 4th, 6th, 7th and 9th layers; Power supply plane is 5th layer; Signal planes are 1st, 3rd, 8th and 10th layers. The single signal via 401 is separated from conductor planes of the PCB by a clearance hole 403.

FIG. 6A shows a top view of a power supply layer which is 5th layer of a vertical transition. The vertical transition is formed by a signal via 401, an assembly of ground vias 402 around the signal via 401, ground plates 408 from conductor layers connected to the ground vias 402, closed ground stripline 405 connecting the ground vias in turn, and an isolating slot 406 between said ground stripline and power supply layer 409 of the PCB (the same as the first exemplary embodiment). The clearance hole 403 separates the signal part (in other words, the inner conductive boundary), and the ground part (in other words, the outer conductive boundary) of the vertical transition. The number of ground vias 402 is 8. In addition, although the number of ground vias 402 is 8 here, the number can be selected as necessary. The distance from the signal via 401 to ground vias 402 can be defined as corresponding to the required characteristic impedance of the vertical transition. The distance between neighboring ground vias 402 forming the vertical transition can be defined for an example as less than λ/4 where λ is the shortest wavelength in the PCB isolating material in the predetermined frequency band. The main requirement to the distance between neighboring ground vias 402 is its difference from resonant dimensions in all predetermined frequency band. This case improves the electrical performance of the vertical transition.

A Third Exemplary Embodiment

Figure 7A:
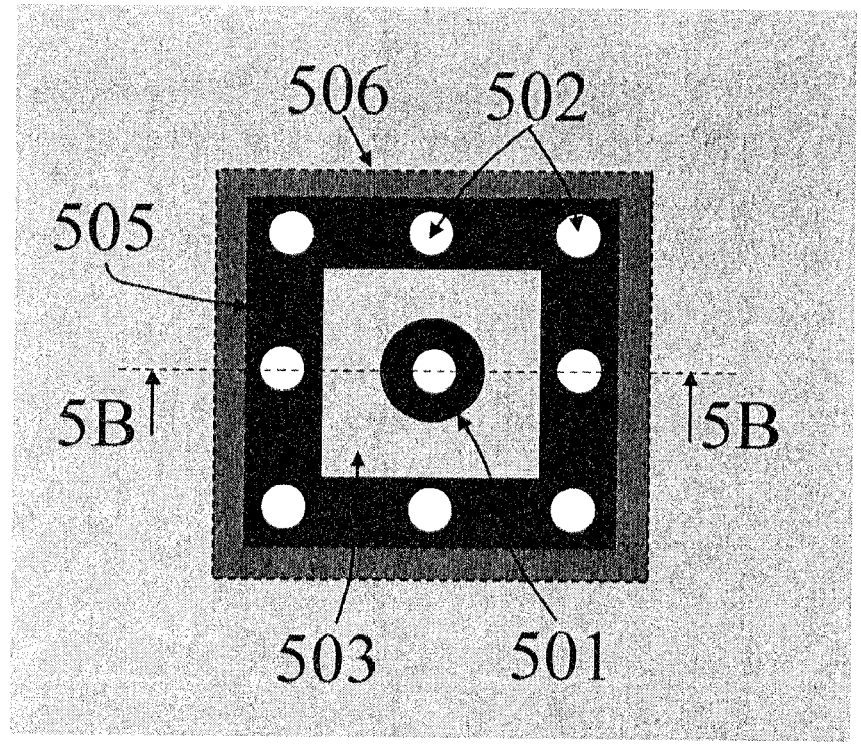
FIG. 7A shows a top view of a vertical transition in a multilayer PCB of a third exemplary embodiment.
Figure 7B:
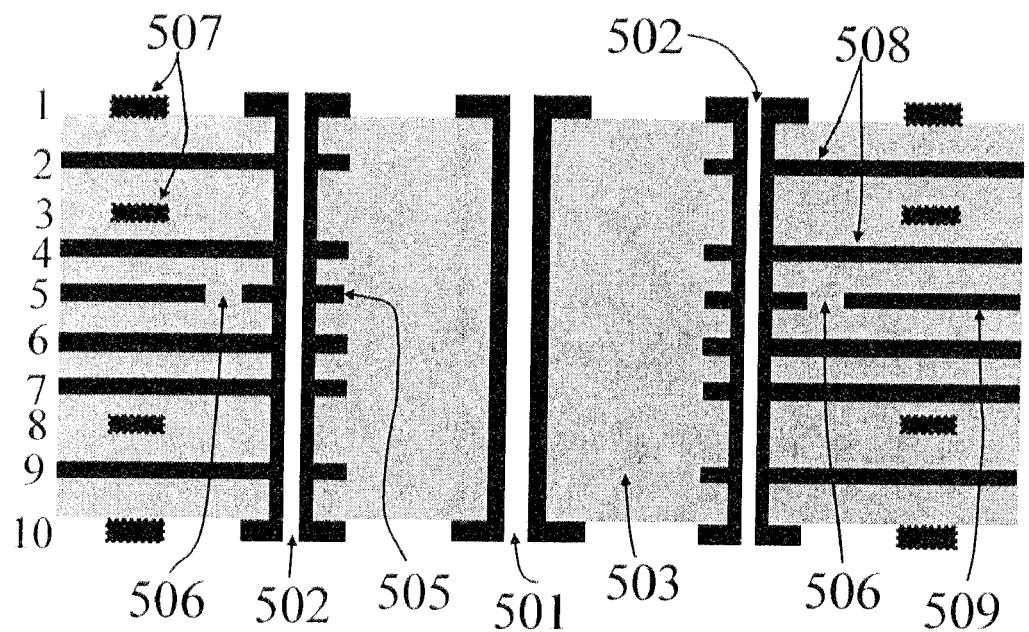
FIG. 7B shows a cross-sectional view of a vertical transition in a multilayer PCB of a third exemplary embodiment.

In FIGS. 7A and 7B a vertical transition with the same arrangement of ground vias as in FIGS. 6A and 6B is shown. This vertical transition is also embedded in a 10-conductor-layer PCB which has the same constitution as that in FIGS. 6A and 6B.

FIG. 7B shows a cross-sectional view of a vertical transition (in a direction of a dotted line 5B in FIG. 7A).

FIG. 7A shows a top view of a power supply layer which is 5th layer of a vertical transition. The vertical transition is formed by a signal via 501, an assembly of ground vias 502 around the signal via 501, ground plates 508 from conductor layers connected to the ground vias 502, closed ground stripline 505 connecting the ground vias in turn, and an isolating slot 506 between said ground stripline and power supply layer 509 of the PCB. The number of ground vias 502 is 8. In addition, although the number of ground vias 502 is 8 here, the number can be selected as necessary. However a clearance hole 503 in this vertical transition has a square shape corresponding to the square ground via arrangement. This shape gives a possibility to provide a minimal return loss of the vertical transition in the predetermined frequency band by an appropriate choice of dimensions of the square clearance hole.

As for an example, these dimensions can be defined by a three-dimensional full-wave electromagnetic-field solver (based on the FDTD algorithm as for an example) changing the side of the square clearance hole as a step-by-step operation. Also known procedures of optimization can be used to define the dimensions of such clearance hole.

A possibility to provide a minimal return loss of the vertical transition in the predetermined frequency band by an appropriate choice of dimensions of the square clearance hole is explained as follows:

A surface impedance of the outer conductive boundary depends on frequencies considerably. Therefore, it is clear that signals propagating at high speed produce frequency dependent return loss and insertion loss. Forming vertical transitions satisfying approximate equations equating a surface impedance with zero can form vertical transitions for a multilayer PCB frequency independent and with low return loss and insertion loss in the wide frequency band.

Based on satisfying approximate equations equating a surface impedance with zero, a top view of the outer boundary of the clearance hole can be defined to correspond to the ground via arrangement in the outer conductive boundary. According to the method, a clearance hole has a square shape corresponding to the square ground via arrangement in the outer conductive boundary. A clearance hole has a round shape corresponding to the round ground via arrangement in the outer conductive boundary. A clearance hole has a elliptical shape corresponding to the elliptical ground via arrangement in the outer conductive boundary. Namely, widening a clearance hole to the ground via can equate a surface impedance which degrades the properties with zero approximately.

Defining the dimensions of a clearance hole is based on satisfying approximate equations equating a surface impedance with zero and securing the connection between ground vias and ground plates in forming the outer conductive boundary.

As described above, forming vertical transitions for a multilayer PCB frequency independent and with low return loss and insertion loss in the wide frequency band can realize higher electrical performance of the vertical transition.

A Fourth Exemplary Embodiment

A vertical transition in a multilayer PCB can be joined to various planar transmission lines such as microstrip lines, striplines, coplanar waveguides and slotlines in the PCB, and also to coaxial cables, bond wires, pins from Large-Scale Integration (LSI) chip packages, and so on.

Figure 8A:
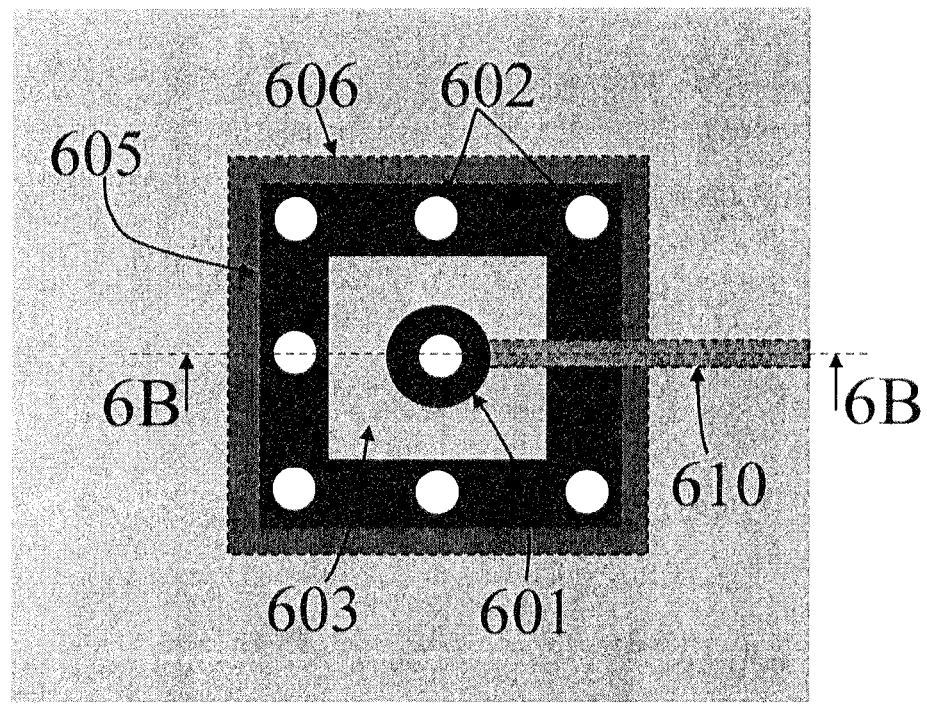
FIG. 8A shows a top view of a vertical transition in a multilayer PCB of a fourth exemplary embodiment.
Figure 8B:
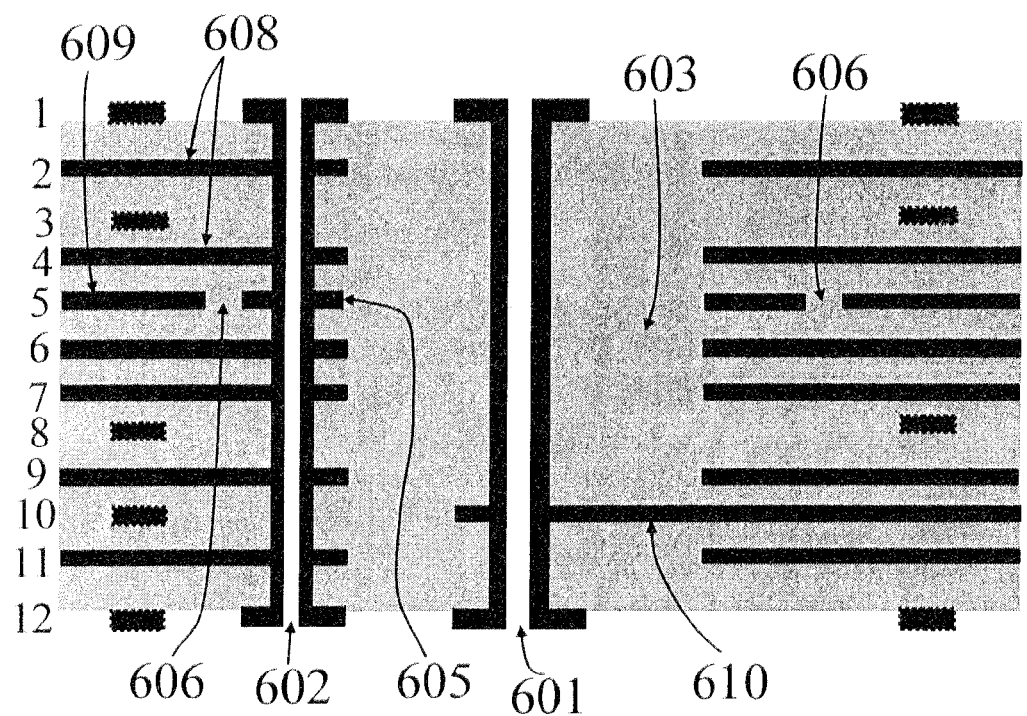
FIG. 8B shows a cross-sectional view of a vertical transition in a multilayer PCB of a fourth exemplary embodiment.

As an example, a connection of a vertical transition to a stripline in a 12-conductor-layer PCB is shown in the FIGS. 8A and 8B.

FIG. 8B shows a cross-sectional view of a vertical transition (in a direction of a dotted line 6B in FIG. 8A), the arrangement of conductor layers of the PCB separated by an isolating material is as follows: Ground planes are 2nd, 4th, 6th, 7th, 9th and 11th layers; Power supply plane is 5th layer; Signal planes are 1st, 3rd, 8th, 10th and 12th layers. The single signal via 601 is separated from conductor planes of the PCB by a clearance hole 603.

FIG. 8A shows a top view of a power supply layer which is 5th layer of a vertical transition on which a top view of a stripline 610 of Signal plane which is 10th layer of a vertical transition is superimposed. In this figure the vertical transition is formed by a signal via 601, an assembly of ground vias 602 around the signal via 601, ground plates from conductor layers 608 connected to the ground vias 602, closed ground stripline 605 connecting the ground vias in turn, and an isolating slot 606 between said ground stripline and power supply layer 609 of the PCB. The number of ground vias 602 is 7. In addition, although the number of ground vias 602 is 7 here, the number can be selected as necessary. The stripline 610 is connected to the vertical transition at the 10th conductor layer as an example. The clearance hole 603 in the vertical transition has a square cross-sectional form as corresponding to the square arrangement of ground via in the vertical transition that can give the higher electrical performance of such vertical transition decreasing the effect of conductive plates disposed between the signal via 601 and the ground vias 602.

A Fifth Exemplary Embodiment

Figure 9A:
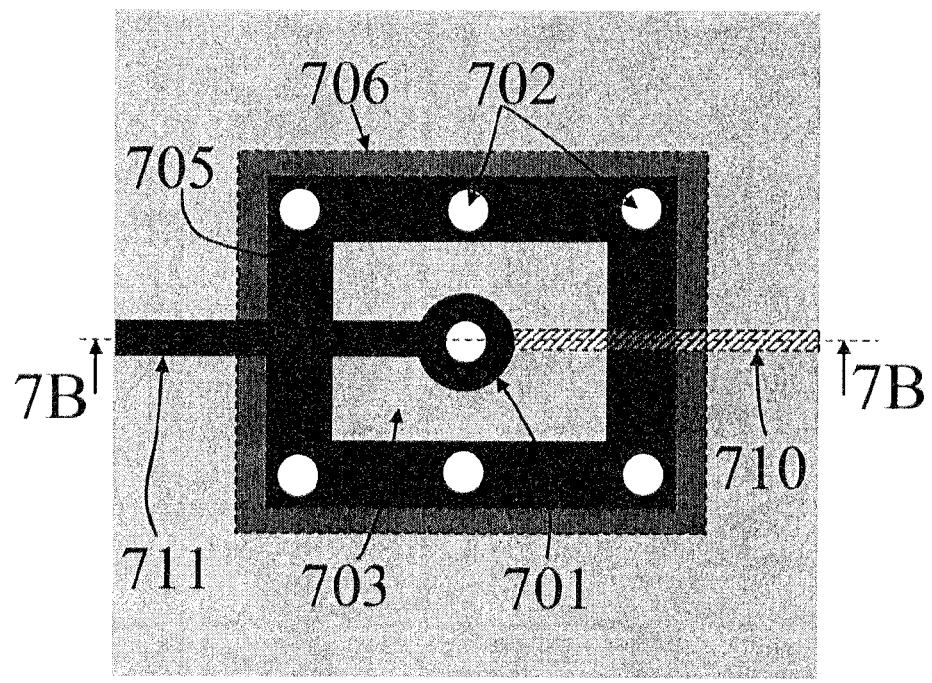
FIG. 9A shows a top view of a vertical transition in a multilayer PCB of a fifth exemplary embodiment.
Figure 9B:
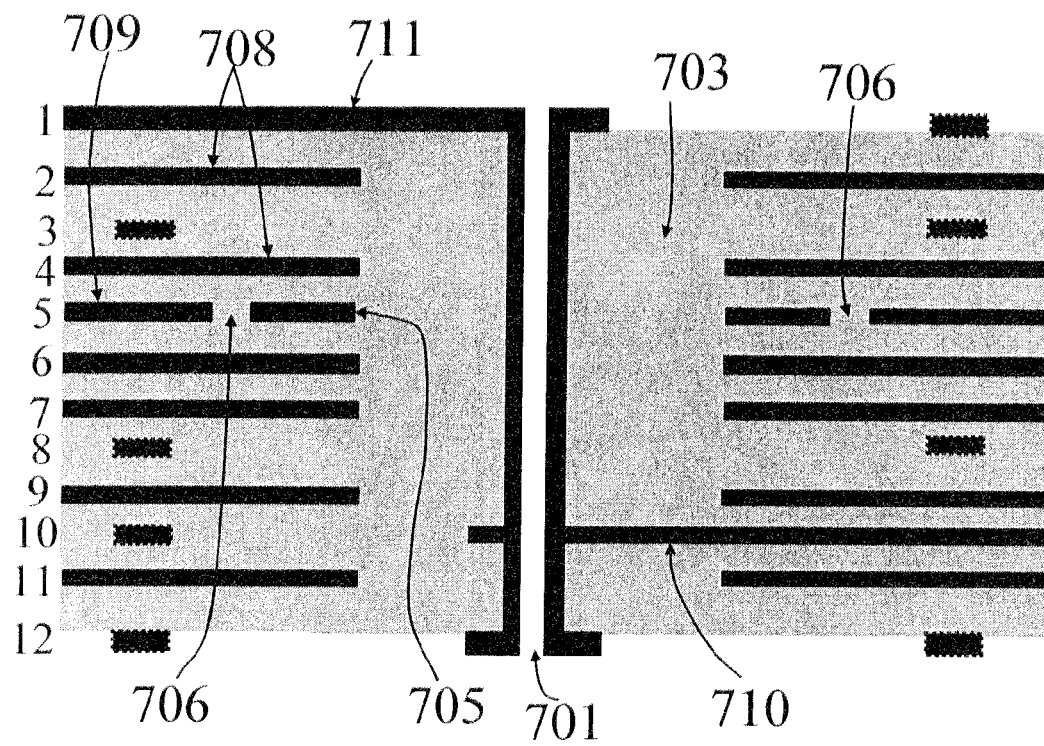
FIG. 9B shows a cross-sectional view of a vertical transition in a multilayer PCB of a fifth exemplary embodiment.

Another interconnected circuit in a multilayer PCB structure formed by the use of a vertical transition is shown in FIGS. 9A and 9B. This vertical transition is also embedded in a 12-conductor-layer PCB which has the same constitution as that in FIGS. 8A and 8B.

FIG. 9B shows a cross-sectional view of a vertical transition (in a direction of a dotted line 7B in FIG. 9A).

FIG. 9A shows a top view of a power supply layer which is 5th layer of a vertical transition on which a top view of a stripline 610 of Signal plane which is first layer of a vertical transition and a top view of a stripline 610 of Signal plane which is 10th layer of a vertical transition are superimposed.

In this structure a microstrip line 711 disposed at the top layer of the PCB is connected to a stripline 710 placed at the 10th conductor layer PCB by means of the vertical transition. This vertical transition is formed by a signal via 701, an assembly of ground vias 702 around the signal via 701, ground plates from conductor layers 708 connected to the ground vias 702, closed ground stripline 705 connecting the ground vias in turn, and an isolating slot 706 between said ground stripline and power supply layer 709 of the PCB. The number of ground vias 702 is 6. In addition, although the number of ground vias 702 is 6 here, the number can be selected as necessary. The clearance hole 703 in the vertical transition has a rectangular form providing the higher electrical performance of considered interconnection.

A Sixth Exemplary Embodiment

Figure 10A:
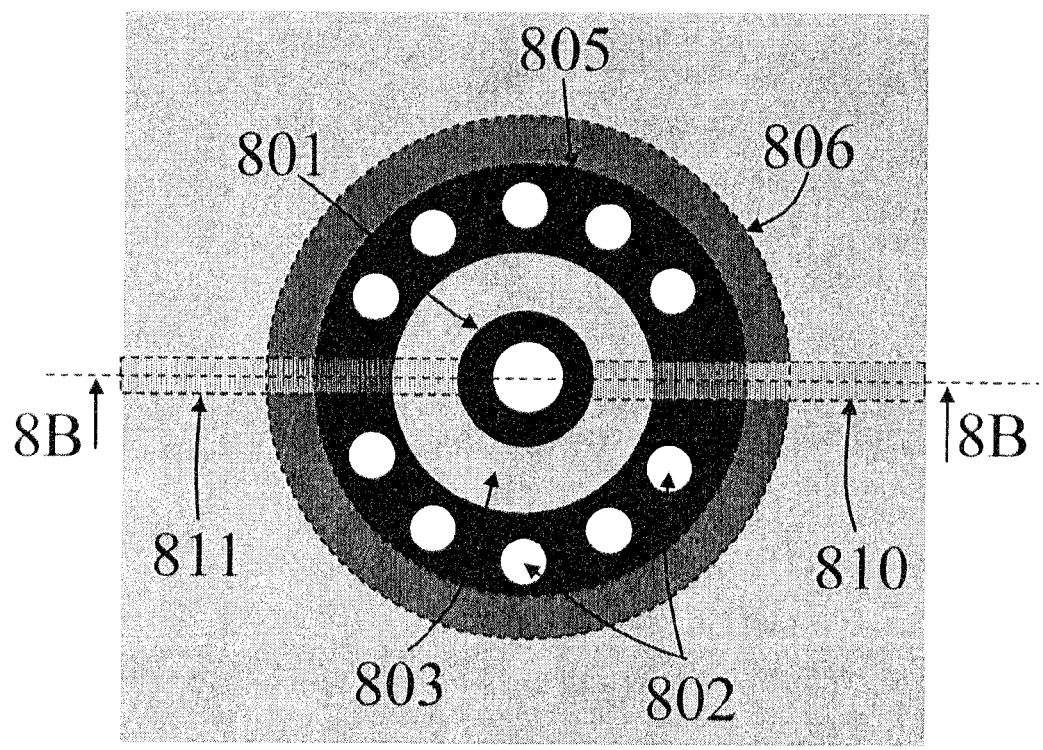
FIG. 10A shows a top view of a vertical transition in a multilayer PCB of a sixth exemplary embodiment.
Figure 10B:
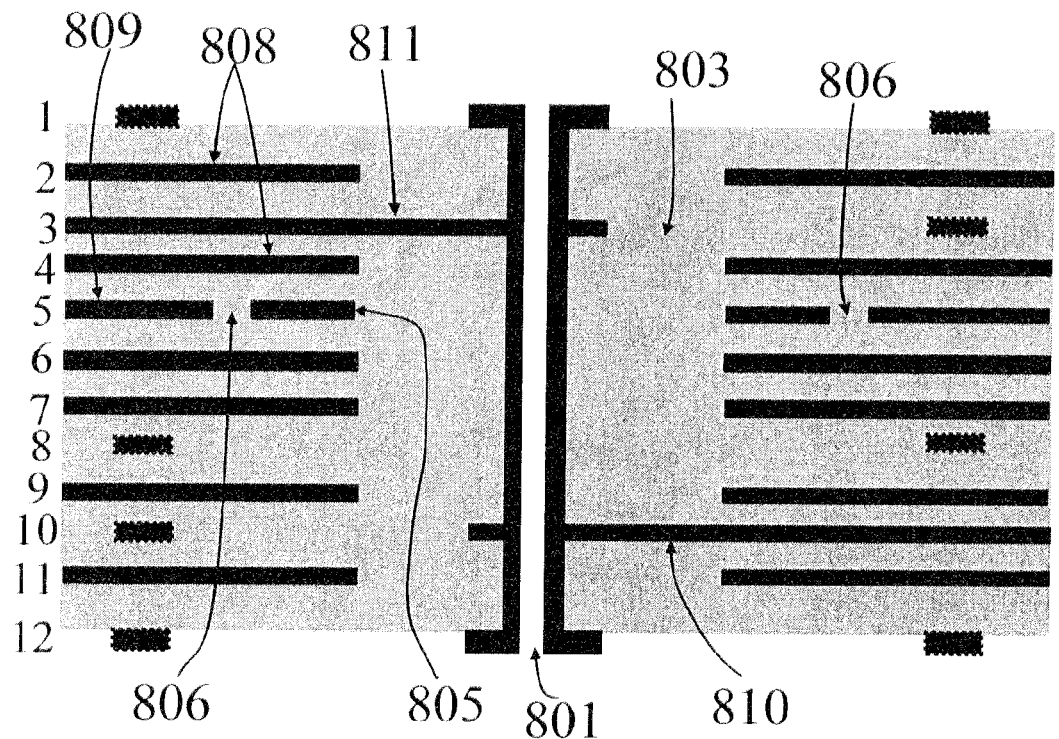
FIG. 10B shows a cross-sectional view of a vertical transition in a multilayer PCB of a sixth exemplary embodiment.

In FIGS. 10A and 10B a vertical transition connecting two striplines 811, 810 disposed at the 3rd and 10th conductor layers of a 12-conductor layer PCB is shown. This vertical transition is also embedded in a 12-conductor-layer PCB which has the same constitution as that in FIGS. 8A and 8B.

FIG. 10B shows a cross-sectional view of a vertical transition (in a direction of a dotted line 8B in FIG. 10A).

FIG. 10A shows a top view of a power supply layer which is 5th layer of a vertical transition on which a top view of a stripline 811 of Signal plane which is third layer of a vertical transition and a top view of a stripline 810 of Signal plane which is 10th layer of a vertical transition are superimposed.

This vertical transition is formed by a signal via 801, an assembly of ground vias 802 around the signal via 801, ground plates 808 from conductor layers connected to the ground vias 802, closed ground stripline 805 connecting the ground vias in turn, and an isolating slot 806 between said ground stripline and power supply layer 809 of the PCB. The number of ground vias 802 is 10. In addition, although the number of ground vias 802 is 10 here, the number can be selected as necessary. The clearance hole 803 in the vertical transition has a round form corresponding to the round arrangement of the ground vias to provide a minimal return loss of presented structure in predetermined frequency band.

A Seventh Exemplary Embodiment

An arbitrary arrangement of ground vias 902 around a signal via 901 is shown in FIGS. 9A and 9B. This vertical transition is embedded in a 8-conductor-layer PCB which serves as an example of multilayer PCBs.

Figure 11A:
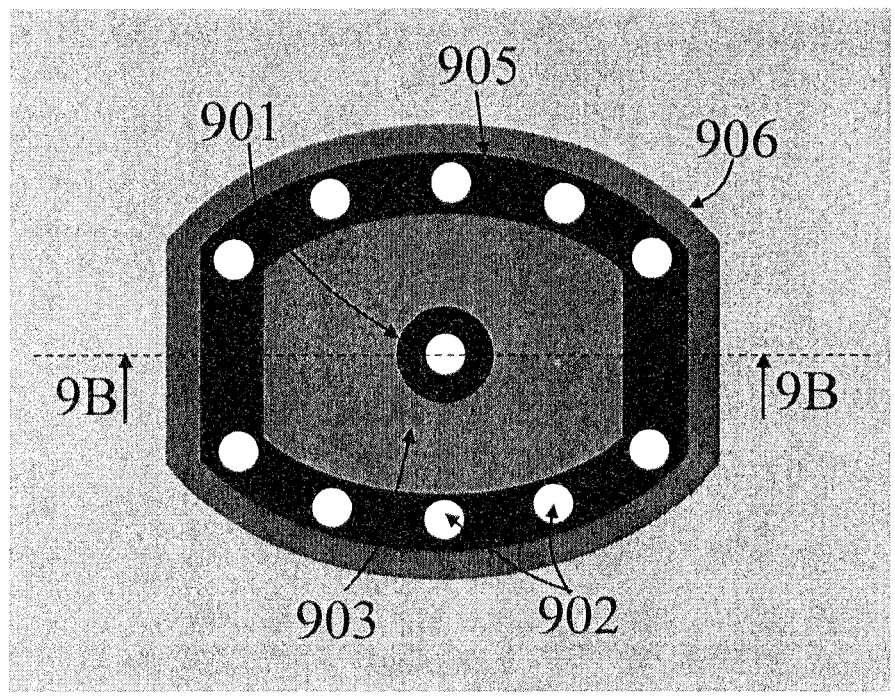
FIG. 11A shows a top view of a vertical transition in a multilayer PCB of a seventh exemplary embodiment.
Figure 11B:
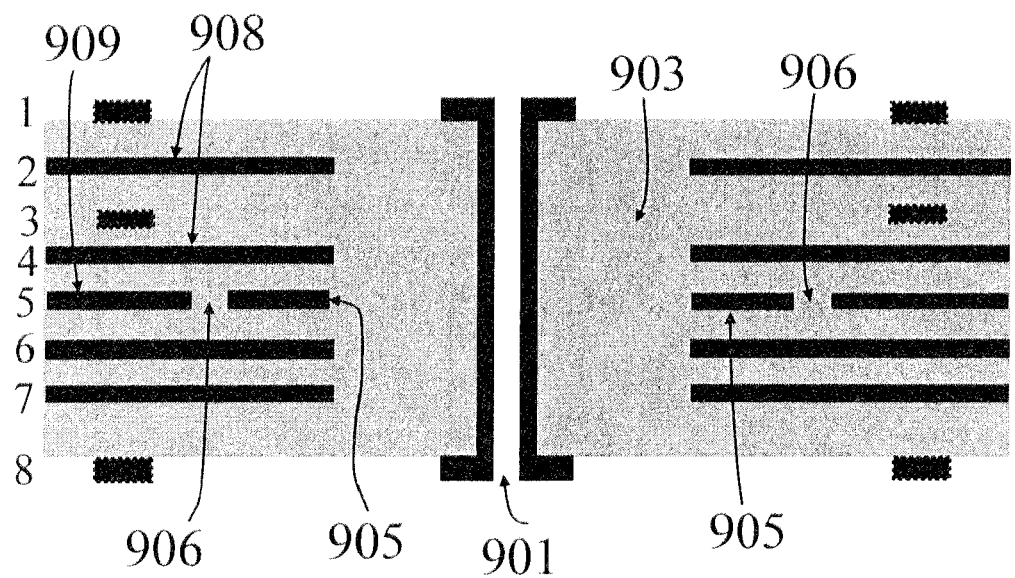
FIG. 11B shows a cross-sectional view of a vertical transition in a multilayer PCB of a seventh exemplary embodiment.

FIG. 11B shows a cross-sectional view of a vertical transition (in a direction of a dotted line 9B in FIG. 11A), the arrangement of conductor layers of the PCB separated by an isolating material is as follows: Ground planes are 2nd, 4th, 6th and 7th layers; Power supply plane is 5th layer; Signal planes are 1st, 3rd and 8th layers. The single signal via 901 is separated from conductor planes of the PCB by a clearance hole 903.

FIG. 11A shows a top view of a power supply layer which is 5th layer of a vertical transition. The number of ground vias 902 is 10. In addition, although the number of ground vias 902 is 10 here, the number can be selected as necessary. Clearance hole 903 in the vertical transition has a chamfered elliptical form as corresponding to the chamfered elliptical arrangement of ground via. Form of arrangement of ground vias is an important factor effecting on the characteristic impedance of the vertical transition. Choosing an arrangement of ground vias around the signal via in the vertical transition one can define the required characteristic impedance. Also clearance hole 903 in this case can be defined as corresponding to the arrangement of ground vias 902 that can provide the lower return loss of considered vertical transition. Note that such type of the ground via arrangement can provide a connection of the signal via to a planar transmission line disposed at a conductor layer of a multilayer PCB by means of increased distance between predefined neighboring ground vias.

Thus, an arrangement of ground vias 902 around a signal via and a clearance hole 903 corresponding to this arrangement of ground vias give a possibility to control the characteristic impedance of the vertical transition in a multilayer PCB and to provide characteristic impedance matching of the vertical transition with other interconnected circuits. Isolation of the vertical transition in the multilayer PCB is provided by the ground vias 902 connected to ground planes and closed ground stripline 905 at the power supply layer 909 separated from the power supply layer 909 by an isolating slot 906.

In considered vertical transition embedded in an 8-conductor-layer PCB shielding properties of the transition are provided by an assembly of ground vias 902 around the signal via 901, ground plates 908 from conductor layers connected to the ground vias 902, closed ground stripline 905 connecting the ground vias 902, and an isolating slot 906 between said ground stripline and power supply layer 909 of the PCB.

An Eighth Exemplary Embodiment

Figure 12A:
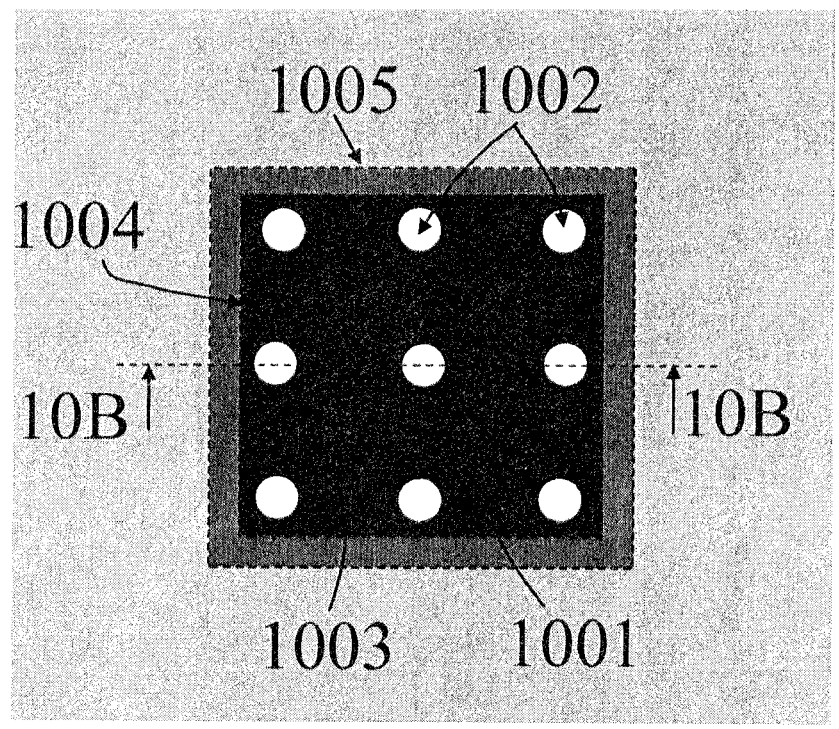
FIG. 12A shows a top view of a vertical transition in a multilayer PCB of an eighth exemplary embodiment.
Figure 12B:
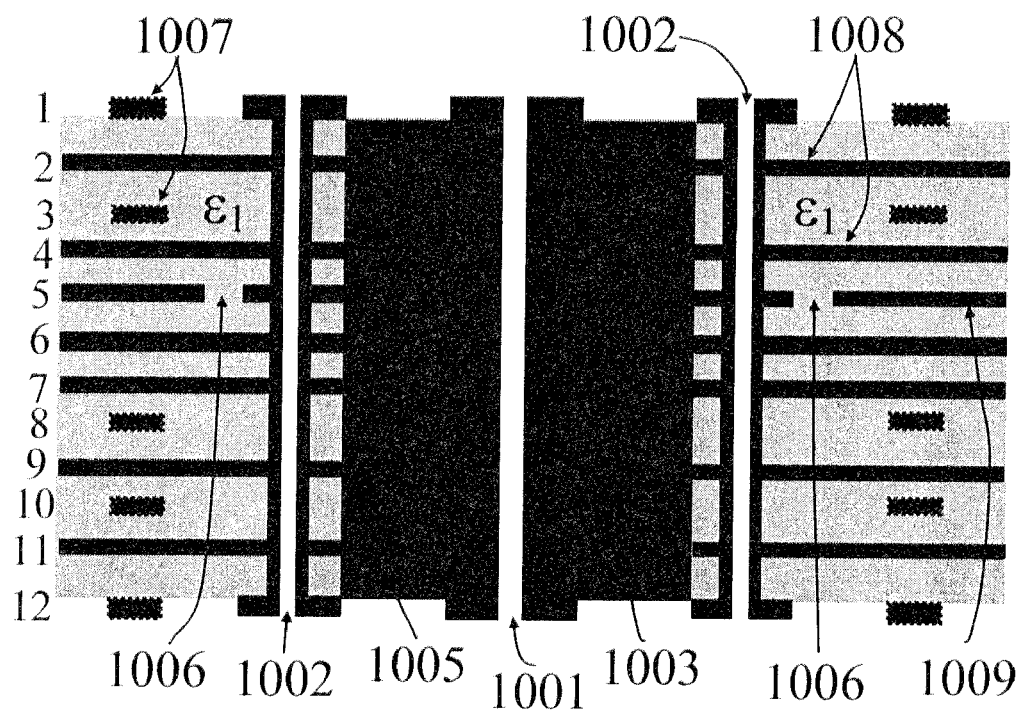
FIG. 12B shows a cross-sectional view of a vertical transition in a multilayer PCB of an eighth exemplary embodiment.

In FIGS. 12A and 12B another type of vertical transitions in a multilayer PCB is shown. This vertical transition is also embedded in a 12-conductor-layer PCB which has the same constitution as that in FIGS. 8A and 8B.

FIG. 12B shows a cross-sectional view of a vertical transition (in a direction of a dotted line 10B in FIG. 12A).

FIG. 12A shows a top view of a power supply layer which is 5th layer of a vertical transition. In this case a vertical transition is formed by a signal via 1001, an assembly of ground vias 1002 around the signal via 1001, ground plates 1008 from conductor layers connected to the ground vias 1002, closed ground stripline 1005 connecting the ground vias in turn, and an isolating slot 1006 between said ground stripline and power supply layer 1009 of the PCB. The number of ground vias 1002 is 8. In addition, although the number of ground vias 1002 is 8 here, the number can be selected as necessary. The characteristic feature of this vertical transition is the use of an isolating material in the clearance hole 1003 for which constitutive parameters (relative permittivity and permeability) are distinctive from constitutive parameters of a material isolating the conductive layers of the PCB. In considered example the relative permittivity of the PCB isolating material is $\epsilon_1$ while the relative permittivity of the material filling the clearance hole 1003 is $\epsilon_2$. Such use of another material in the clearance hole can lead to compact dimensions of vertical transitions because in this case the characteristic impedance control can be provided by a choice of an appropriate material in the clearance hole.

As for an example, if the PCB is filled by the FR-4 with relative permittivity approximately equal to 4.5 and loss tangent approximately equal to 0.024, then using the Teflon® with relative permittivity of about 2.1 and loss tangent of about 0.0005 to fill in the clearance hole one can design the vertical transition with more compact transverse dimensions compared with the vertical transition filled in FR-4 material only. It can be explained by the use of well-known formula for the characteristic impedance of low-loss transmission line structures as:

$$Z_0 = \sqrt{\frac{L}{C}}; \quad (1)$$

where L is the distributed inductance and C is the distribute capacitance.

According to this formula decreasing capacitance by means of the lower relative permittivity leads to smaller distance between signal and ground vias to provide the same characteristic impedance as compared of the case of homogeneous filling of the PCB and the vertical transition.

A Ninth Exemplary Embodiment

Figure 13A:
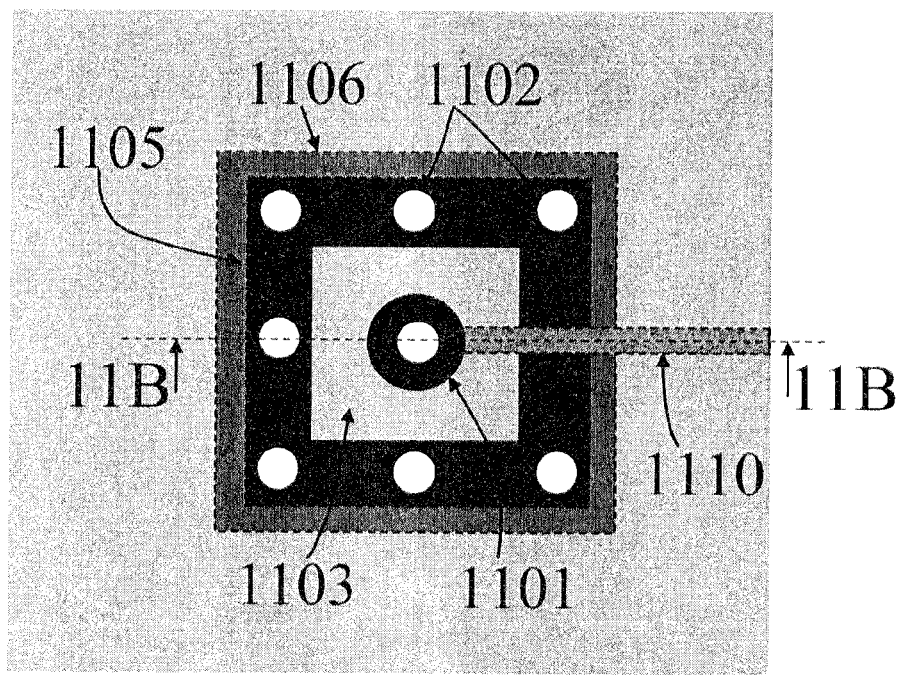
FIG. 13A shows a top view of a vertical transition in a multilayer PCB of a ninth exemplary embodiment.
Figure 13B:
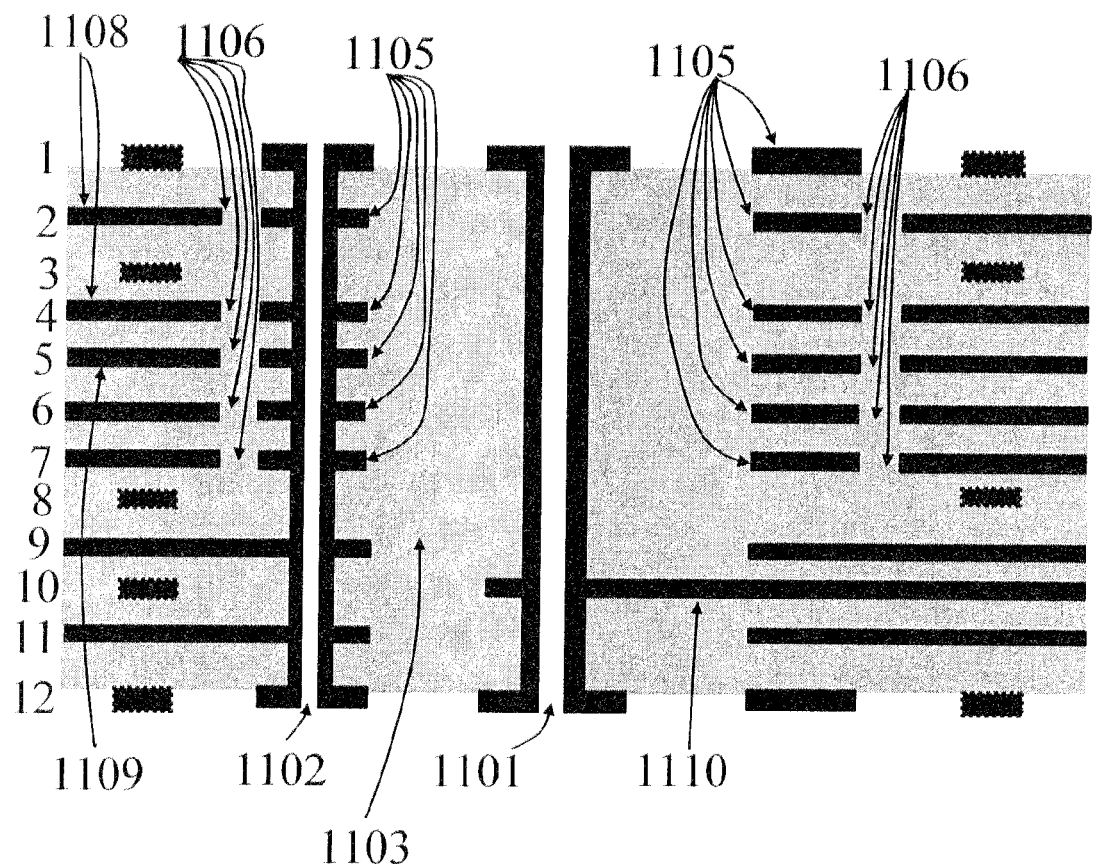
FIG. 13B shows a cross-sectional view of a vertical transition in a multilayer PCB of a ninth exemplary embodiment.

A type of vertical transitions is shown in FIGS. 13A and 13B. This vertical transition is also embedded in a 12-conductor-layer PCB which has the same constitution as that in FIGS. 8A and 8B.

FIG. 13B shows a cross-sectional view of a vertical transition (in a direction of a dotted line 11B in FIG. 13A).

FIG. 13A shows a top view of a power supply layer which is 5th layer of a vertical transition on which a top view of a stripline 1110 of Signal plane which is 10th layer of a vertical transition are superimposed. The number of ground vias 1102 is 7. In addition, although the number of ground vias 1102 is 7 here, the number can be selected as necessary.

The vertical transition is formed by a signal via 1101, an assembly of ground vias 1102 around the signal via 1101, closed ground striplines 1105 connecting the ground vias in turn, isolating slots 1106 between said ground striplines and both power supply layer 1109 and ground layers 1108, and ground plates from conductor layers which participate in forming stripline 1110. It should be noted that closed striplines 1105 and isolating slots 1106 are formed at all ground layers except ground layers forming the stripline 1110 (in considered example these are 9th and 11th layers).

A Tenth Exemplary Embodiment

Figure 14A:
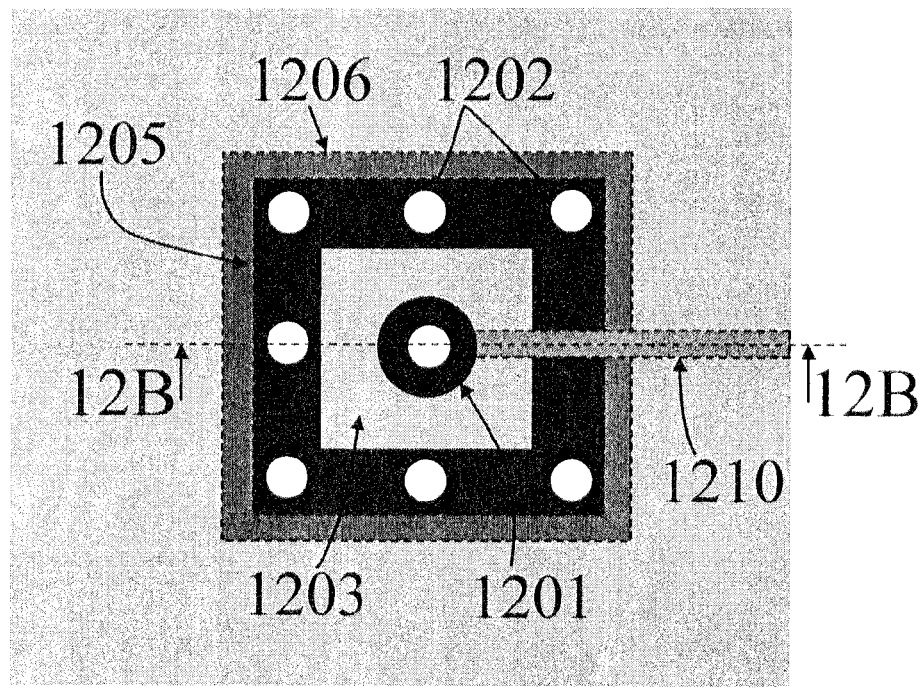
FIG. 14A shows a top view of a vertical transition in a multilayer PCB of a 10th exemplary embodiment.
Figure 14B:
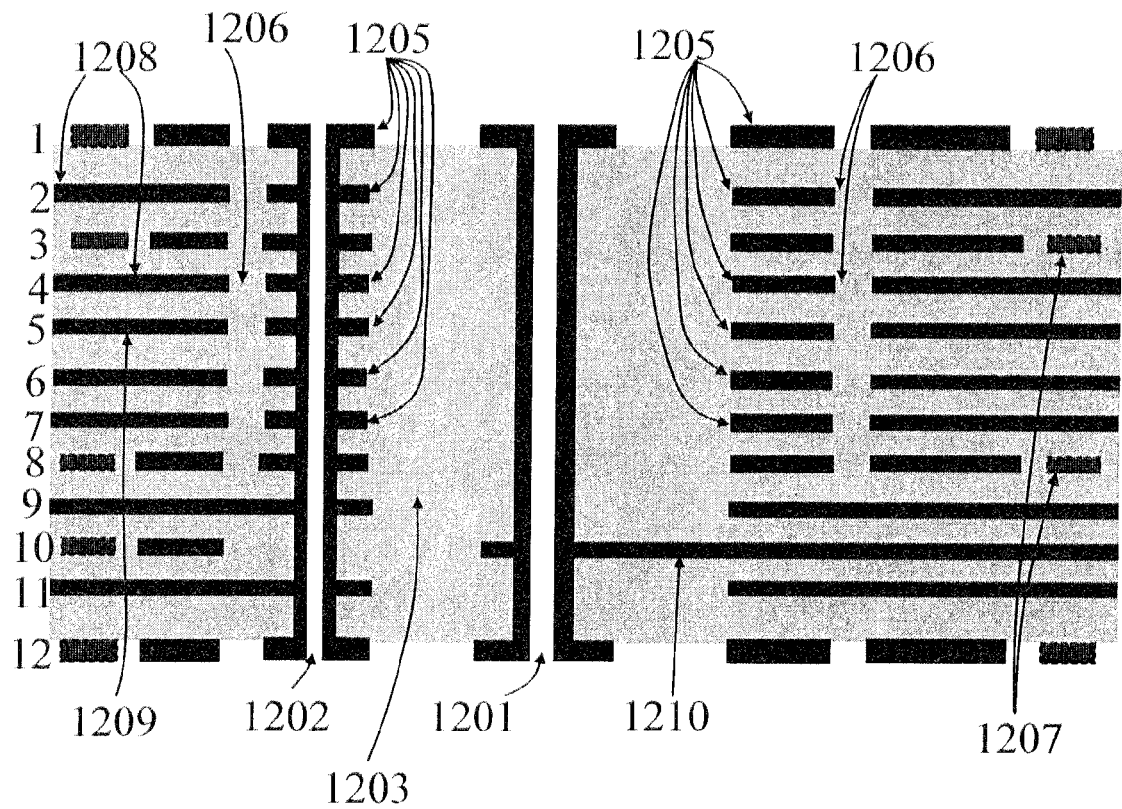
FIG. 14B shows a cross-sectional view of a vertical transition in a multilayer PCB of a 10th exemplary embodiment.

A type of vertical transitions is shown in FIGS. 14A and 14B. This vertical transition is also embedded in a 12-conductor-layer PCB which has the same constitution as that in FIGS. 8A and 8B.

FIG. 14B shows a cross-sectional view of a vertical transition (in a direction of a dotted line 12B in FIG. 14A).

FIG. 14A shows a top view of a power supply layer which is 5th layer of a vertical transition on which a top view of a stripline 1210 of Signal plane which is 10th layer of a vertical transition are superimposed. In this type, a vertical transition is formed by a signal via 1201, an assembly of ground vias 1202 around the signal via 1201, closed ground striplines 1205 connecting the ground vias in turn, isolating slots 1206 between said ground striplines and power supply layer 1209, ground layers 1208 and signal layer 1207, and ground plates from conductor layers which participate in forming stripline 1210. The number of ground vias 1202 is 7. In addition, although the number of ground vias 1202 is 7 here, the number can be selected as necessary. It should be noted that closed striplines and isolating slots are formed at all conductor layers except layers forming the stripline 1210 (in considered case these are 9th, 10th, and 11th layers).

An Eleventh Exemplary Embodiment

Figure 15A:
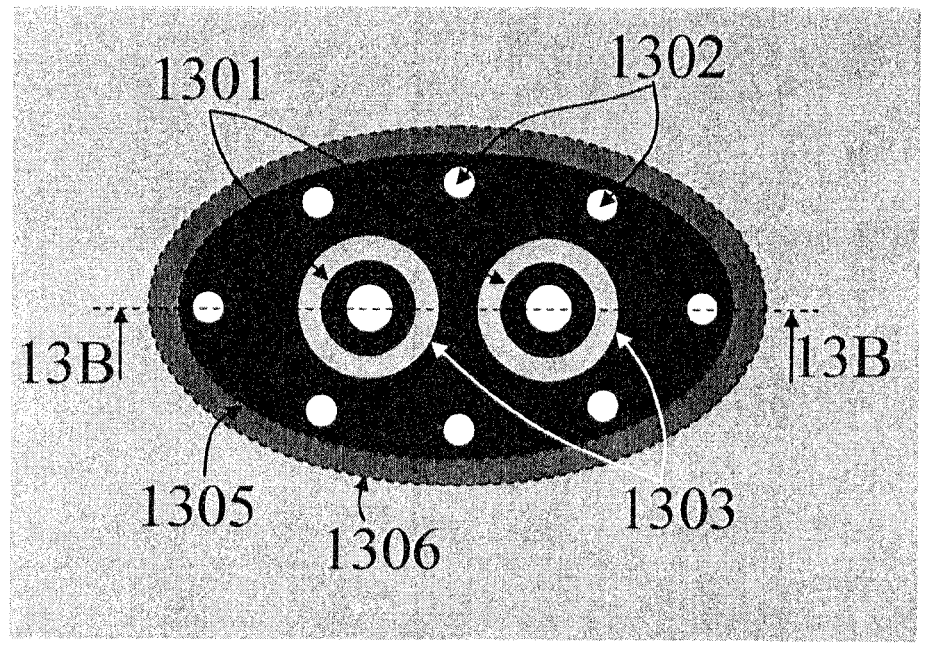
FIG. 15A shows a top view of a vertical transition in a multilayer PCB of a 11th exemplary embodiment.
Figure 15B:
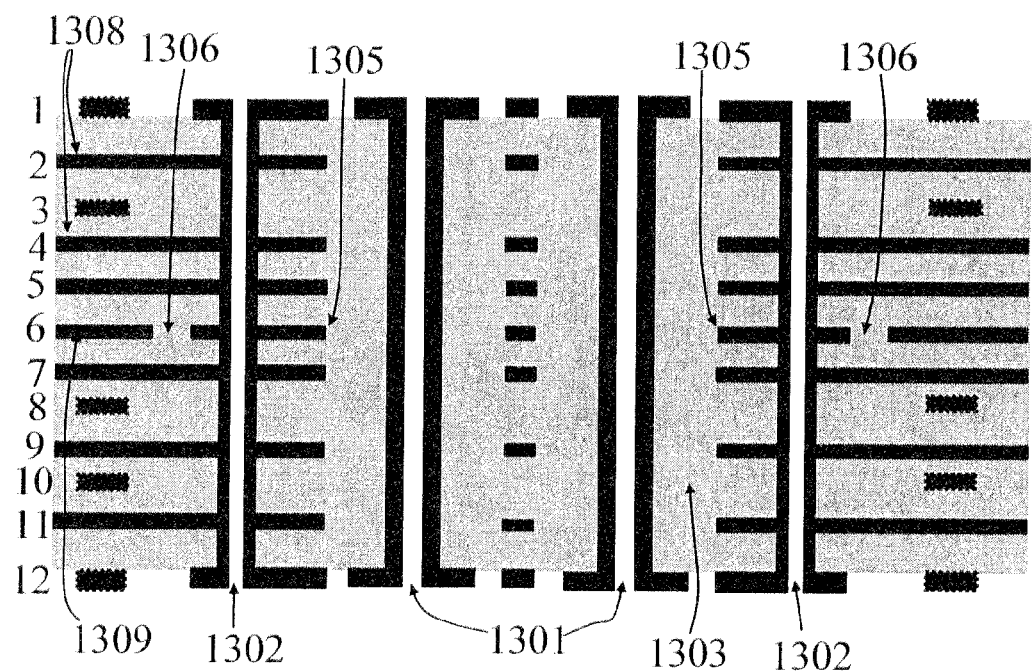
FIG. 15B shows a cross-sectional view of a vertical transition in a multilayer PCB of a 11th exemplary embodiment.

It should be emphasized that a vertical transition can be formed with different number of signal vias in FIGS. 15A and 15B.

FIG. 15B shows a cross-sectional view of a vertical transition (in a direction of a dotted line 13B in FIG. 15A), the arrangement of conductor layers of the PCB separated by an isolating material is as follows: Ground planes are 2nd, 4th, 5th, 7th, 9th and 11th layers; Power supply plane is 6th layer; Signal planes are 1st, 3rd, 8th, 10th and 12th layers. The two coupled signal vias 1301 are separated from conductor planes of the PCB by a clearance hole 1303.

FIG. 15A shows a top view of a power supply layer which is 6th layer of a vertical transition.

The vertical transition is formed by two coupled signal vias 1301, an assembly of ground vias 1302 around the signal vias 1301, ground plates 1308 from conductor layers connected to the ground vias 1302, closed ground stripline 1305 connecting the ground vias in turn, and an isolating slot 1306 between said ground stripline and power supply layer 1309 of the PCB. The number of ground vias 1302 is 8. In addition, although the number of ground vias 1302 is 8 here, the number can be selected as necessary. The clearance hole 1303 in the vertical transition separates signals vias 1301 from ground plates of the vertical transition.

One of most important reasons of the special consideration of signal via pair forming a vertical transition is that two coupled signal vias can be used for differential signaling in differential interconnected circuits. It is well-known that differential signaling demonstrates completely different electromagnetic behavior if it is compared with single-ended signaling. In particular, differential signaling can significantly eliminate noise from ground system and reduce radiating emission.

A Twelfth Exemplary Embodiment

Figure 16A:
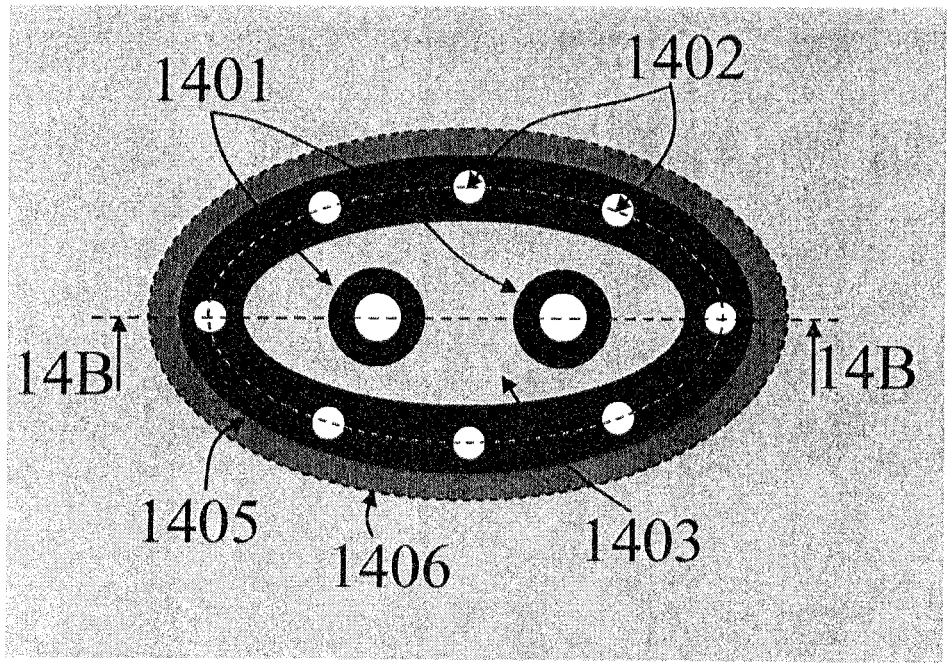
FIG. 16A shows a top view of a vertical transition in a multilayer PCB of a 12th exemplary embodiment.
Figure 16B:
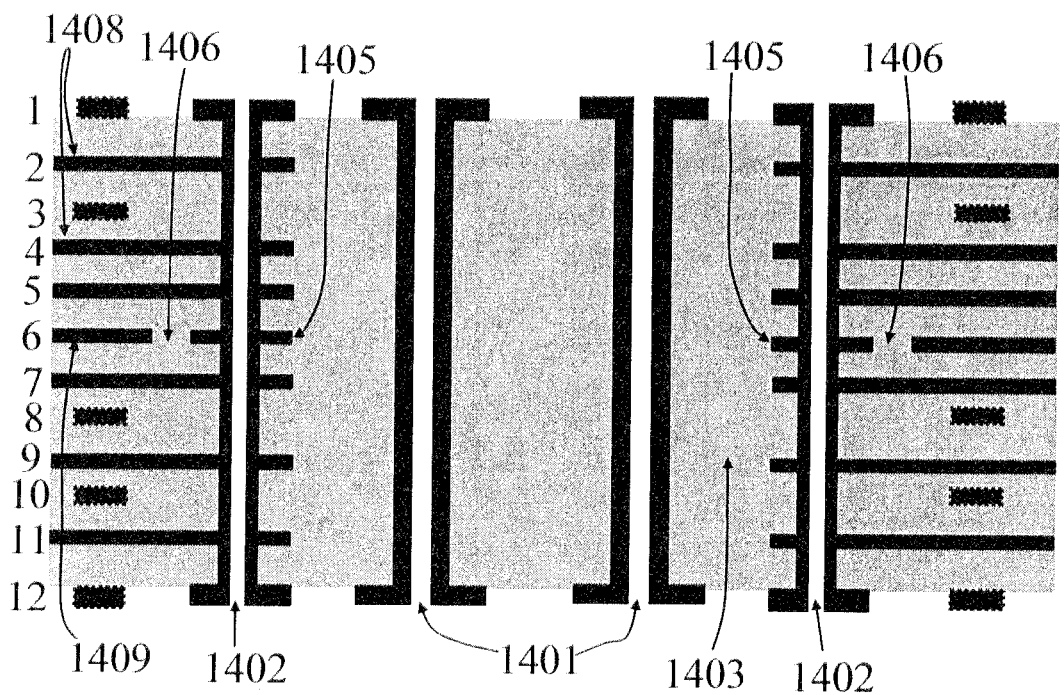
FIG. 16B shows a cross-sectional view of a vertical transition in a multilayer PCB of a 12th exemplary embodiment.

It should be emphasized also that a vertical transition can be formed with different number of signal vias in FIGS. 16A and 16B.

This vertical transition is also embedded in a 12-conductor-layer PCB which has the same constitution as that in FIGS. 8A and 8B.

FIG. 16B shows a cross-sectional view of a vertical transition (in a direction of a dotted line 14B in FIG. 16A).

FIG. 16A shows a top view of a power supply layer which is 6th layer of a vertical transition.

The vertical transition is also formed by two coupled signal vias 1401, an assembly of ground vias 1402 around the signal vias 1401, ground plates 1408 from conductor layers connected to the ground vias 1402, closed ground stripline 1405 connecting the ground vias in turn, and an isolating slot 1406 between said ground stripline and power supply layer 1409 of the PCB. The number of ground vias 1402 is 8. In addition, although the number of ground vias 1402 is 8 here, the number can be selected as necessary. However in this vertical transition the clearance hole 1403 has an elliptical cross-sectional form corresponding to the elliptical arrangement of the ground vias to provide a minimal return loss of presented vertical transition. Note the dimensions of the elliptical clearance hole providing the minimal return losses can be defined by a three-dimensional full-wave electromagnetic-field solver or an optimization procedure for an example.

A 13th Exemplary Embodiment

Figure 17:
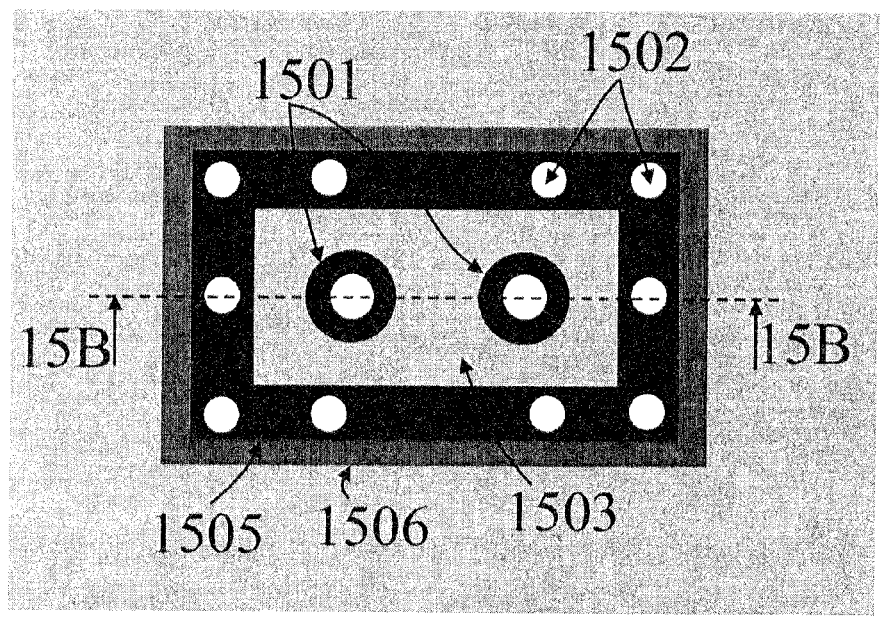
FIG. 17 shows a top view of a vertical transition in a multilayer PCB of a 13th exemplary embodiment.

It should be emphasized also that a vertical transition can be formed with different number of signal vias in FIG. 17.

FIG. 17 shows a top view of a power supply layer of a vertical transition.

Arrangement of ground vias around a signal via pair and form and dimensions of the clearance hole can use to control the characteristic impedance of a high-isolated vertical transition and to provide the wide-frequency band operation of the transition. In FIG. 17, as an example, a rectangular arrangement of ground vias 1502 surrounding a signal via pair 1501 and corresponding to this arrangement the rectangular clearance hole 1503 are shown. Also this vertical transition is formed by ground plates from conductor layers of a multilayer PCB connected to the ground vias 1502, closed ground stripline 1505 connecting the ground vias in turn, and an isolating slot 1506 between said ground stripline and power supply layer of the PCB. The number of ground vias 1502 is 10. In addition, although the number of ground vias 1502 is 10 here, the number can be selected as necessary.

A 14th Exemplary Embodiment

Figure 18A:
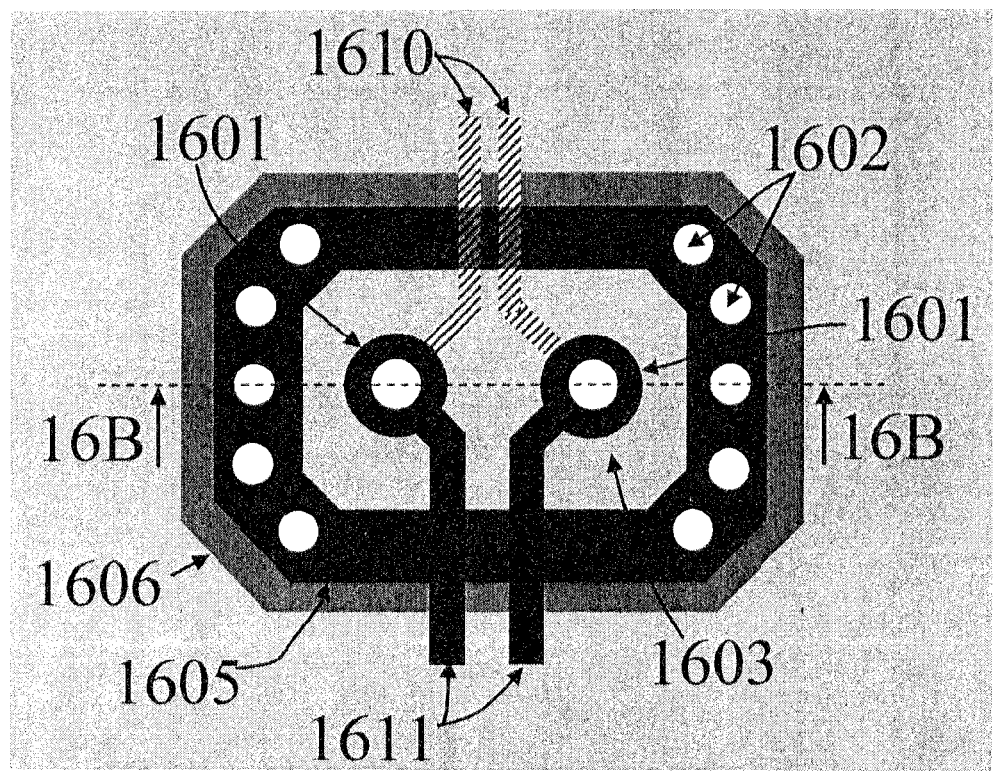
FIG. 18A shows a top view of a vertical transition in a multilayer PCB of a 14th exemplary embodiment.
Figure 18B:
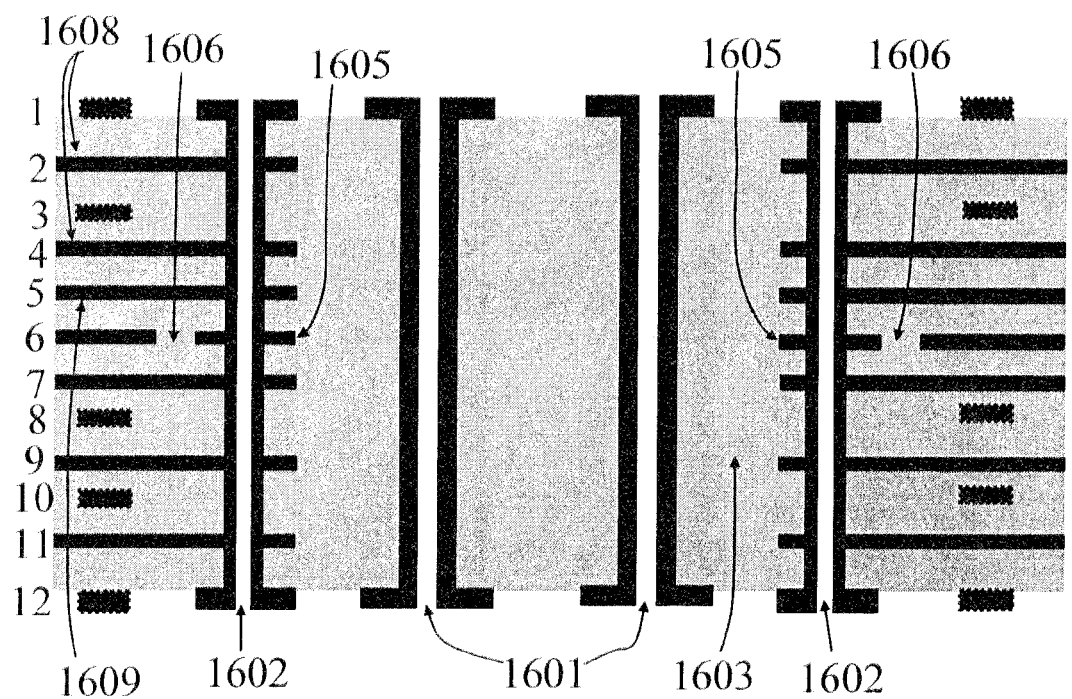
FIG. 18B shows a cross-sectional view of a vertical transition in a multilayer PCB of a 14th exemplary embodiment.

It should be emphasized also that a vertical transition can be formed with different number of signal vias in FIGS. 18A and 18B.

This vertical transition is also embedded in a 12-conductor-layer PCB which has the same constitution as that in FIGS. 15A and 15B.

FIG. 18B shows a cross-sectional view of a vertical transition (in a direction of a dotted line 16B in FIG. 18A).

FIG. 18A shows a top view of a power supply layer which is 6th layer of a vertical transition on which a top view of a stripline pair 1610 and a microstrip line pair 1611 is superimposed.

As an example, a vertical transition connecting a stripline pair 1610 and a microstrip line pair 1611 is shown in FIGS. 18A and 18B.

This vertical transition is formed by two coupled signal vias 1601, an assembly of ground vias 1602 around the signal via pair 1601, ground plates 1608 from conductor layers connected to the ground vias 1602, closed ground stripline 1605 connecting the ground vias in turn, and an isolating slot 1606 between said ground stripline and power supply layer 1609 of the PCB. The number of ground vias 1602 is 10. In addition, although the number of ground vias 1602 is 10 here, the number can be selected as necessary. The clearance hole 1603 in the high-isolated vertical transition has a chamfered rectangular cross-sectional form corresponding to the chamfered rectangular arrangement of the ground vias to provide the higher electrical performance of the vertical transition.

Above-mentioned examples of vertical transitions are applied in multilayer PCB technologies. However, it is well understandable that these vertical transitions can be used in any multilayer structures having power supply, ground and signal conductor layers.

A 15th Exemplary Embodiment

Figure 19A:
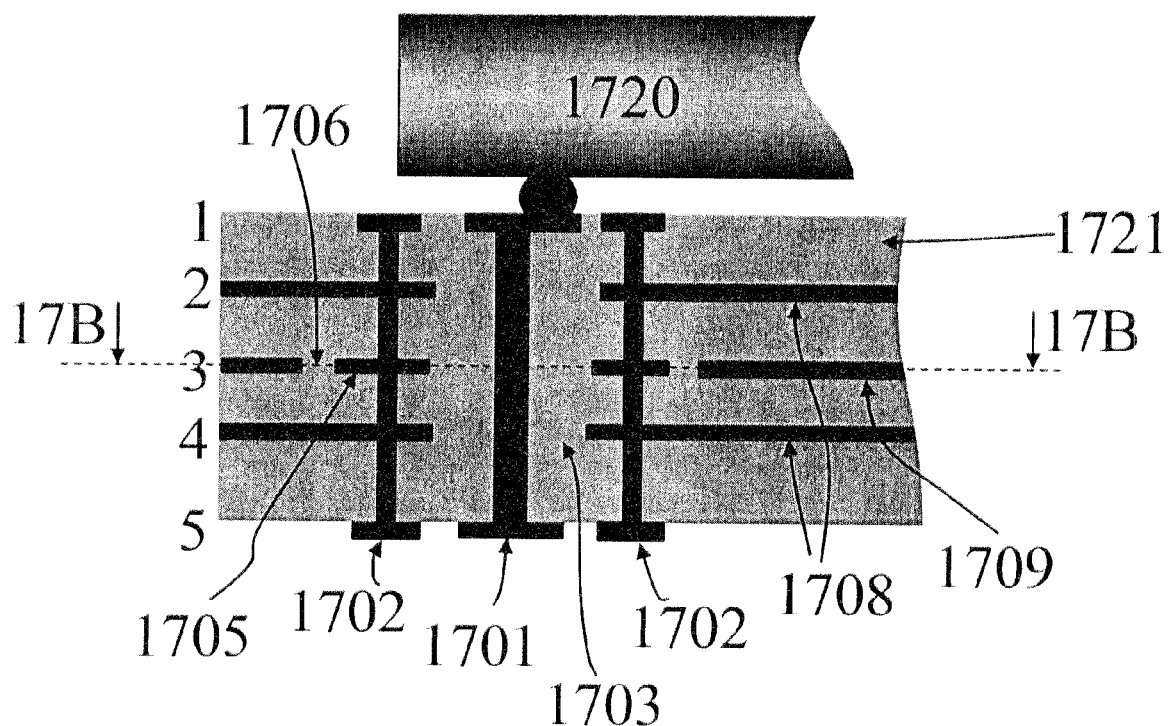
FIG. 19A shows a top view of a vertical transition in a multilayer PCB of a 15th exemplary embodiment.
Figure 19B:
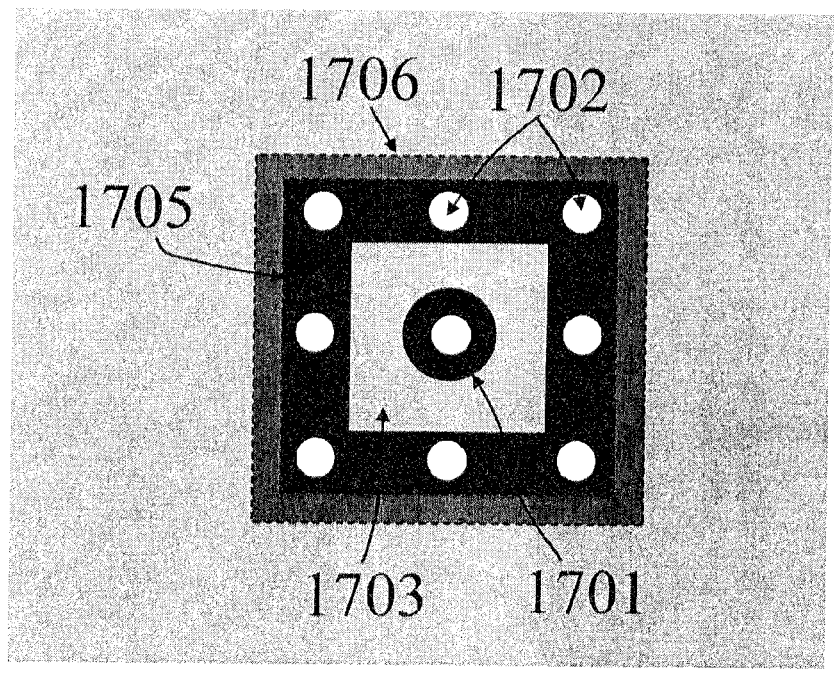
FIG. 19B shows a cross-sectional view of a vertical transition in a multilayer PCB of a 15th exemplary embodiment.

As for an example, in FIG. 19A a side view of a vertical transition in a multilayer package 1721 from one pin of a chip 1720 is shown. In this figure arrangement of conductor layers of the multilayer package is as follows: Ground planes are 2nd and 4th layers; Power supply plane is 3rd layer. Also, in FIG. 19B, the cross-sectional view of the vertical transition at the 3rd conductor layer (in a direction of a dotted line 17B in FIG. 19A) is presented.

The vertical transition is formed by a signal via 1701, an assembly of ground vias 1702 of a square arrangement (which serves as an example only of ground via arrangement in the vertical transition) around the signal via 1701, ground plates 1708 from conductor layers connected to the ground vias 1702, closed ground stripline 1705 connecting the ground vias in turn, and an isolating slot 1706 between said ground stripline and power supply layer 1709 of the multilayer package. The number of ground vias 1702 is 8. In addition, although the number of ground vias 1702 is 8 here, the number can be selected as necessary. The clearance hole 1703 separates the signal and ground parts of the vertical transition. The characteristic feature of this vertical transition is the use of an isolating material in the clearance hole 1703 for which constitutive parameters (relative permittivity and permeability) are distinctive from constitutive parameters of a material isolating the conductive layers of the PCB as explained in FIG. 12B.

A 16th Exemplary Embodiment

Figure 20A:
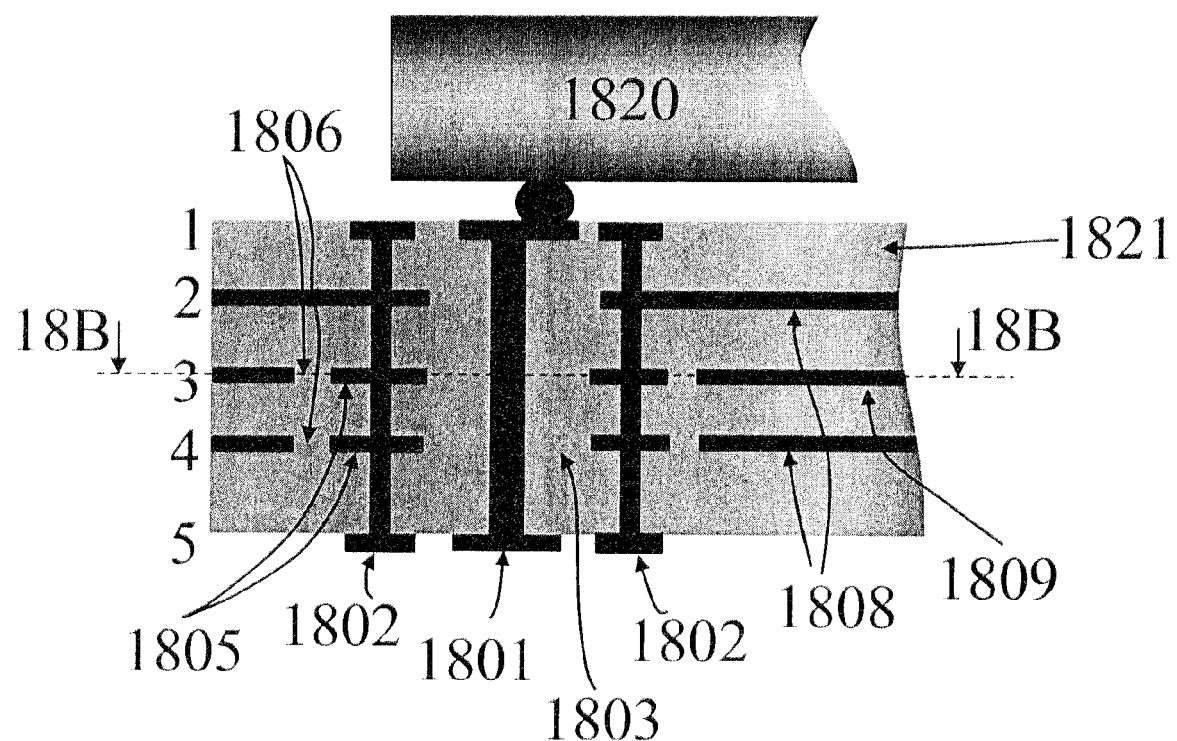
FIG. 20A shows a top view of a vertical transition in a multilayer PCB of a 16th exemplary embodiment.
Figure 20B:
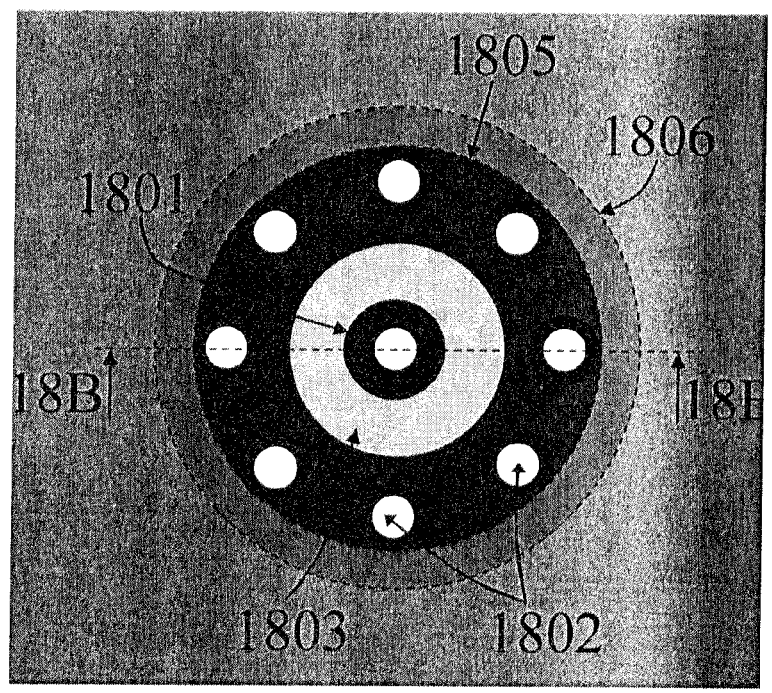
FIG. 20B shows a cross-sectional view of a vertical transition in a multilayer PCB of a 16th exemplary embodiment.

As for another example, a side view of vertical transition in a multilayer package 1821 from one pin of a chip 1820 is shown in FIG. 20A. In this figure, arrangement of conductor layers of the multilayer package is the same as for FIG. 19A. In FIG. 20B, the cross-sectional view of this vertical transition at the 3rd conductor layer (in a direction of a dotted line 18B in FIG. 20A) is demonstrated. The vertical transition in considered case is formed by a signal via 1801, an assembly of ground vias 1802 of a round arrangement (which serves as another example of ground via arrangement in the vertical transition) around the signal via 1801, ground plate 1808 from the second conductor layers connected to the ground vias 1802, closed ground stripline 1805 at third conductor layer connecting the ground vias in turn, an isolating slot 1806 between said ground stripline and power supply layer 1809, and also closed stripline 1805 disposed at the fourth conductor layer and separated from ground plate at this conductor layer by an isolating slot 1806. The number of ground vias 1802 is 8. In addition, although the number of ground vias 1802 is 8 here, the number can be selected as necessary. The clearance hole 1803 separates the signal and ground parts of the vertical transition.

A 17th Exemplary Embodiment)

Figure 21A:
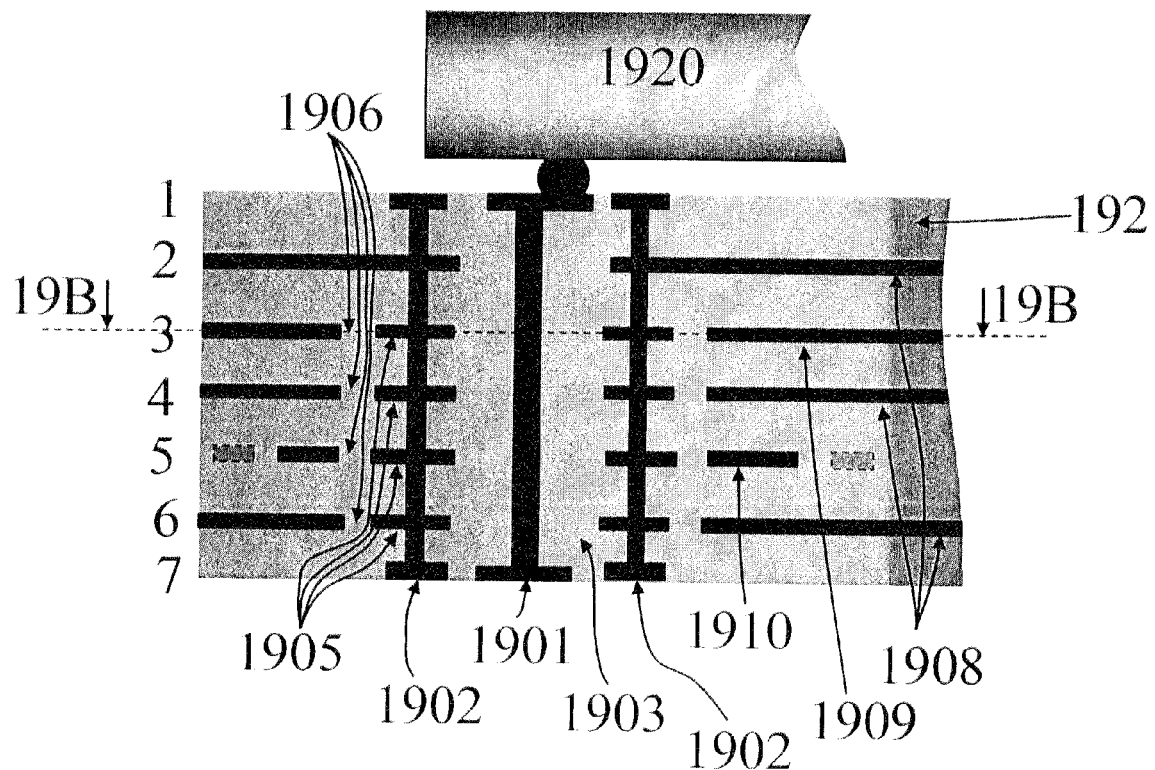
FIG. 21A shows a top view of a vertical transition in a multilayer PCB of a 17th exemplary embodiment.
Figure 21B:
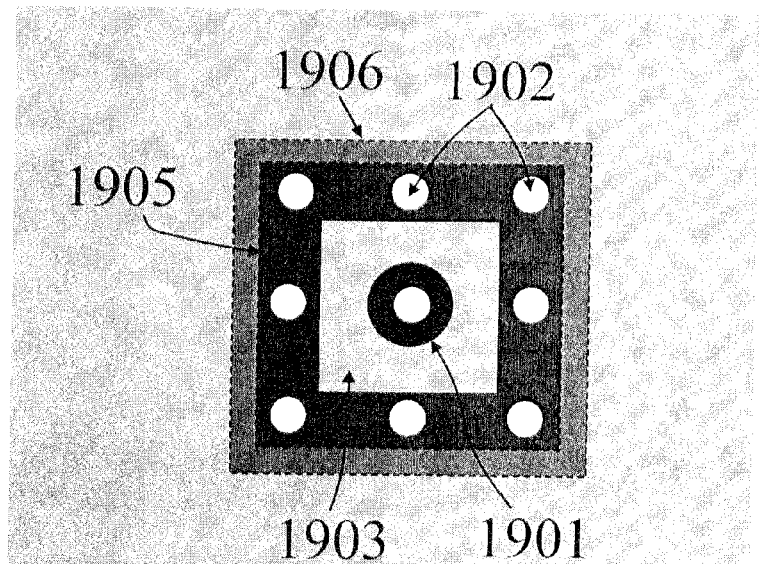
FIG. 21B shows a cross-sectional view of a vertical transition in a multilayer PCB of a 17th exemplary embodiment.

In FIG. 21A, a side view of a vertical transition in a multilayer package 1921 from one pin of a chip 1920 is shown. In this figure, arrangement of conductor layers in the 7-conductor layer package is as follows: Ground planes are the 2nd, 4th and 6th layers; Power supply plane is the 3rd; Signal plane is the 5th layer. Also, in FIG. 21B, the cross-sectional view of the vertical transition at the 3rd conductor layer (in a direction of a dotted line 19B in FIG. 21A) is demonstrated. Here, the vertical transition is formed by a signal via 1901, an assembly of ground vias 1902 of a square arrangement (which serves as another example of ground via arrangement in the vertical transition) around the signal via 1901, ground plate 1908 from the second conductor layers connected to the ground vias 1902, closed ground stripline 1905 at the third conductor layer connecting the ground vias in turn, an isolating slot 1906 between said ground stripline and power supply layer 1909, and also closed striplines 1905 disposed at the fourth and sixth ground layers and fifth signal conductor layers separated by isolating slots 1906 from other conductors. The number of ground vias 1902 is 8. In addition, although the number of ground vias 1902 is 8 here, the number can be selected as necessary. The clearance hole 1903 serves to separate the signal and ground parts of the vertical transition.

It should be noted that design methods and structures of high-isolated vertical transitions proposed for the use in multilayer PCBs can be directly applied to multilayer packaging which applies multilayer structures to a package. As for example structures of vertical transitions shown in FIGS. 6-18 for multilayer PCB can be used for multilayer packaging also.

Moreover, it is clear that proposed high-isolated vertical transitions can be formed for any multilayer substrate technologies comprising signal, ground and power supply layers.

Although it is described that a main target is power supply layers as conductor layers in which isolating slots are formed, isolating slots may be provided in signal layers or ground layers.

In addition, isolating slots can be provided by combining power supply layers and/or signal layers and/or ground layers respectively. For example, isolating slots can be provided in power supply layers and ground layers as ninth exemplary embodiment shown in FIGS. 13A and 13B. Isolating slots can be provided in power supply layers, signal layers and ground layers as tenth exemplary embodiment shown in FIGS. 14A and 14B.

The invention claimed is:

1. A vertical transition which comprises at least one signal via and a plurality of ground vias around said at least one signal via, said vertical transition comprising:
    a plurality of conductor layers;
    a plurality of isolating layers between said conductor layers; and
    a plurality of closed striplines connected to said ground vias, wherein:
    at least one conductor layer is separated from said closed stripline by an isolating slot.

2. The vertical transition according to claim 1, wherein:
    at least one conductor layer which is separated from said closed stripline is a power supply layer.

3. The vertical transition according to claim 1, wherein:
    at least one conductor layer which is separated from said closed stripline is a ground layer.

4. The vertical transition according to claim 1, wherein:
    at least one conductor layer which is separated from said closed stripline is a signal layer.

5. The vertical transition according to claim 1, wherein:
    at least two conductor layers which are separated from said closed striplines are a power supply layer and a ground layer.

6. The vertical transition according to claim 1, wherein:
    at least two conductor layers which are separated from said closed striplines are a power supply layer and a signal layer.

7. The vertical transition according to claim 1, wherein:
    at least two conductor layers which are separated from said closed striplines are a ground layer and a signal layer.

8. The vertical transition according to claim 1, wherein:
    at least three conductor layers which are separated from said closed striplines are a power supply layer, a ground layer and a signal layer.

9. The vertical transition according to claim 1, further comprising:
    a clearance hole separating said signal via from said plurality of ground vias, wherein:
    said clearance is filled by an isolating material with constitutive parameters (relative permittivity and permeability) which are different from constitutive parameters of a PCB isolating material.

10. A printed circuit board including a vertical transition which comprises at least one signal via and a plurality of ground vias around said at least one signal via, said vertical transition comprising:
    a plurality of conductor layers;
    a plurality of isolating layers between said conductor layers; and
    a plurality of closed striplines connected to said ground vias, wherein:
    at least one conductor layer is separated from said closed stripline by an isolating slot.

11. The printed circuit board according to claim 10, wherein:
at least one conductor layer which is separated from said closed stripline is a power supply layer.

12. The printed circuit board according to claim 10, wherein:
at least one conductor layer which is separated from said closed stripline is a ground layer.

13. The printed circuit board according to claim 10, wherein:
at least one conductor layer which is separated from said closed stripline is a signal layer.

14. The printed circuit board according to claim 10, wherein:
at least two conductor layers which are separated from said closed strip line are a power supply layer and a ground layer.

15. The printed circuit board according to claim 10, wherein:
at least two conductor layers which are separated from said closed stripline are a power supply layer and a signal layer.

16. The printed circuit board according to claim 10, wherein:
at least two conductor layers which are separated from said closed striplines are a ground layer and a signal layer.

17. The printed circuit board according to claim 10, wherein:
at least three conductor layers which are separated from said closed striplines are a power supply layer, a ground layer and a signal layer.

18. The printed circuit board according to claim 10, further comprising:
a clearance hole separating said signal via from said plurality of ground vias, wherein:
said clearance is filled by an isolating material with constitutive parameters (relative permittivity and permeability) which are different from constitutive parameters of a PCB isolating material.

19. A semiconductor package comprising:
a printed circuit board; and
a semiconductor chip, wherein:
said printed circuit board including a vertical transition which comprises at least one signal via and a plurality of ground vias around said at least one signal via, said vertical transition comprising:
a plurality of conductor layers;
a plurality of isolating layers between said conductor layers; and
a plurality of closed striplines connected to said ground vias; wherein:
at least one conductor layer is separated from said closed stripline by an isolating slot, and wherein:
said semiconductor chip connecting a signal terminal to said signal via of said printed circuit board and connecting a ground terminal to said ground vias of said printed circuit board.

20. The semiconductor package according to claim 19, wherein:
at least one conductor layer which is separated from said closed stripline is a power supply layer.

21. The semiconductor package according to claim 19, wherein:
at least one conductor layer which is separated from said closed stripline is a ground layer.

22. The semiconductor package according to claim 19, wherein:
at least one conductor layer which is separated from said closed stripline is a signal layer.

23. The semiconductor package according to claim 19, wherein:
at least two conductor layers which are separated from said closed striplines are a power supply layer and a ground layer.

24. The semiconductor package according to claim 19, wherein:
at least two conductor layers which are separated from said closed striplines are a power supply layer and a signal layer.

25. The semiconductor package according to claim 19, wherein:
at least two conductor layers which are separated from said closed striplines are a ground layer and a signal layer.

26. The semiconductor package according to claim 19, wherein:
at least three conductor layers which are separated from said closed striplines are a power supply layer, a ground layer and a signal layer.

27. The semiconductor package according to claim 19, further comprising:
a clearance hole separating said signal via from said plurality of ground vias, wherein:
said clearance is filled by an isolating material with constitutive parameters (relative permittivity and permeability) which are different from constitutive parameters of a PCB isolating material.

* * * * *